(12) United States Patent
Nakasugi et al.

(10) Patent No.: US 11,914,296 B2
(45) Date of Patent: *Feb. 27, 2024

(54) ETHYNYL DERIVED COMPOSITE, A COMPOSITION COMPRISING THEREOF, A METHOD FOR MANUFACTURING A COATING BY IT, AND A METHOD FOR MANUFACTURING A DEVICE COMPRISING THE COATING

(71) Applicant: Merck Patent GmbH, Darmstadt (DE)

(72) Inventors: Shigemasa Nakasugi, Yamato (JP); Yusuke Hama, Kakegawa (JP); Hiroshi Yanagita, Kakegawa (JP); Takashi Sekito, Kakegawa (JP); Yuriko Matsuura, Kakegawa (JP)

(73) Assignee: Merck Patent GmbH, Darmstadt (DE)

( * ) Notice: Subject to any disclaimer, the term of this patent is extended or adjusted under 35 U.S.C. 154(b) by 0 days.

This patent is subject to a terminal disclaimer.

(21) Appl. No.: 18/113,089

(22) Filed: Feb. 23, 2023

(65) Prior Publication Data

US 2023/0194989 A1 Jun. 22, 2023

Related U.S. Application Data

(63) Continuation of application No. 16/956,733, filed as application No. PCT/EP2018/085147 on Dec. 17, 2018, now Pat. No. 11,609,498.

(30) Foreign Application Priority Data

Dec. 20, 2017 (EP) ..................................... 17208939

(51) Int. Cl.
  *G03F 7/09* (2006.01)
  *C08G 8/02* (2006.01)
  (Continued)

(52) U.S. Cl.
  CPC ............... *G03F 7/094* (2013.01); *C08G 8/02* (2013.01); *C08G 8/30* (2013.01); *C09D 161/16* (2013.01); *G03F 7/11* (2013.01)

(58) Field of Classification Search
  CPC .. G03F 7/094; G03F 7/11; C08G 8/02; C08G 8/30; C09D 161/16
  See application file for complete search history.

(56) References Cited

U.S. PATENT DOCUMENTS 3,474,054 A 10/1969 White
4,200,729 A 4/1980 Calbo
(Continued)

FOREIGN PATENT DOCUMENTS

CN 106565952 A 4/2017
JP 2016-167047 A 9/2016
(Continued)

OTHER PUBLICATIONS

International Preliminary Report on Patentability received for PCT Patent Application No. PCT/EP2018/085147, dated Jul. 2, 2020, 9 pages.
(Continued)

*Primary Examiner* — Shane Fang
(74) *Attorney, Agent, or Firm* — Faegre Drinker Biddle & Reath LLP

(57) ABSTRACT

[Problem to be Solved] An object is to provide a compound with good heat resistance. And another object is to provide a coating made exhibits less film shrinkage, good gap filling property and good planarization. [Solution] The present invention provides an ethynyl derived composite and a composition comprising thereof. And the present invention provides a method for manufacturing a coating by it, and a method for manufacturing a device.

20 Claims, 1 Drawing Sheet

(a)

(51) Int. Cl.
  *C08G 8/30*   (2006.01)
  *C09D 161/16*  (2006.01)
  *G03F 7/11*   (2006.01)

(56)            References Cited

U.S. PATENT DOCUMENTS

| | | |
|---|---|---|
| 4,251,665 A | 2/1981 | Calbo |
| 5,187,019 A | 2/1993 | Calbo et al. |
| 8,952,121 B2 | 2/2015 | Paulasaari |
| 2013/0189533 A1 | 7/2013 | Someya et al. |
| 2015/0011092 A1 | 1/2015 | Someya et al. |
| 2016/0053132 A1 | 2/2016 | Lee et al. |
| 2016/0257842 A1 | 9/2016 | Wakamatsu et al. |
| 2016/0314984 A1 | 10/2016 | Matsumura et al. |
| 2017/0015779 A1 | 1/2017 | Jung et al. |
| 2017/0018436 A1 | 1/2017 | Hatakeyama et al. |
| 2017/0137663 A9 | 5/2017 | Wakamatsu et al. |
| 2017/0184968 A1* | 6/2017 | Kori .................. C09D 5/008 |

FOREIGN PATENT DOCUMENTS

| | | |
|---|---|---|
| JP | 2016-206676 A | 12/2016 |
| WO | 2015/194273 A1 | 12/2015 |

OTHER PUBLICATIONS

International Search Report and Written Opinion received for PCT Patent Application No. PCT/EP2018/085147, dated Feb. 25, 2019, 11 pages.

* cited by examiner (a)

(b)

ETHYNYL DERIVED COMPOSITE, A COMPOSITION COMPRISING THEREOF, A METHOD FOR MANUFACTURING A COATING BY IT, AND A METHOD FOR MANUFACTURING A DEVICE COMPRISING THE COATING

CROSS-REFERENCE TO RELATED APPLICATIONS

This application is a continuation of U.S. application Ser. No. 16/956,733, filed Jun. 22, 2020, which is a National stage application (under 35 U.S.C. § 371) of PCT/EP2018/085147, filed Dec. 17, 2018, which claims benefit of European Application No. 17208939.3, filed Dec. 20, 2017, all of which are incorporated herein by reference in their entirety.

TECHNICAL FIELD

The present invention relates to an ethynyl derived composite and a composition comprising thereof. And the present invention relates to a method for manufacturing a coating by it, and a method for manufacturing a device.

BACKGROUND ART

In device (for example semiconductor device) manufacturing processes, lithography technology using a photoresist (hereinafter, simply referred to as "resist") is generally employed for fine processing. The fine processing includes the steps of: forming a thin photoresist layer on a semiconductor substrate such as a silicon wafer; covering the layer with a mask pattern corresponding to the pattern of the intended device; exposing the layer with active light such as ultraviolet light through the mask pattern; developing the exposed layer to obtain a photoresist pattern; and etching the substrate using the obtained photoresist pattern as a protective coating, thus forming a fine concave-convex corresponding to the above-described pattern.

Because of the high integration and the three-dimensionalization of semiconductors in recently years, there is a requirement for further layer coating on the substrate processed to have fine concave-convex patterns, and repeated processing.

Resist compositions and other layer compositions can be coated on such substrates as liquid state, and can be cured by irradiation, heating and so on to obtain resist coating and other coatings. Resist coatings and other coatings are laminated in such high-defined environment, and require high quality with regard to some properties, for example film forming, avoiding inter-mixing with another layers, and so on.

Under these circumstance, specific compounds having carbon-carbon triple bond for resist underlayer compositions were studied, which could be used with PGMEA and so on as solvent, could be good at solvent disabilities, etching resistances, heat resistances and gap filling (Patent Literature 1).

And, specific novolac polymer condensed by biphenols or bisphenofluorenes and fluorene were studied, which was mentioned for potential applicability for semiconductor industry as a hard mask and dielectric material (Patent Literature 2).

CITATION LIST

Patent Literature

[Patent Literature 1] JP2016167047A
[Patent Literature 2] U.S. Pat. No. 8,952,121B2

SUMMARY OF INVENTION

Technical Problem

The present inventors thought compounds with heat resistances are useful for lithography process, for example as resist underlayer compositions. And they thought compounds are useful which exhibit less decomposed and/or less weight loss under high temperature for long term circumstance, for example temperature raised gradually. And they thought compounds are useful for manufacturing process which exhibit less film thickness shrinkage when high temperature bake are done. Fine and complicated processed substrate (for example, stepped substrate) may have structures (wall, hole and so on) on itself, which are distributed not uniformly but unevenly (with dense and sparse). The present inventors thought compositions are desirable for example semiconductor manufacturing processes, which can be filled in such substrate, and the surface of the coating made by the composition can be planarized. When a substrate has dense and sparse regions, it is difficult for a coating formed from a composition on the substrate to be planarized, since there occur interactions among components of the composition, because of surface tension and/or contraction during conversion to the coating. The composition invented by the present inventors can yield high planarization even when formed into a coating on a substrate having dense and sparse regions as described above. Based on such concepts described above, the present inventors found ethynyl derived composites and compositions comprising thereof. As an additional advantage, additives can be decreased in those compositions of the present invention.

Solution to Problem

An ethynyl derived composite comprises unit A and unit B, wherein unit A is represented by formula (1),

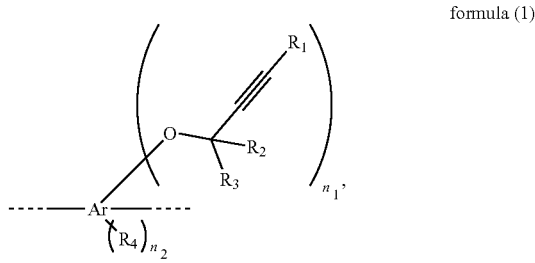

formula (1)

Ar is $C_{6\text{-}41}$ aromatic hydrocarbon ring
$R_1$ is hydrogen, halogen, cyano, unsubstituted $C_{1\text{-}6}$ alkyl, $C_{1\text{-}6}$ alkyl substituted with at least one substituent selected from the group consisting of $C_{1\text{-}6}$ alkyl, halogen and cyano, unsubstituted $C_{3\text{-}20}$ aromatic ring, or $C_{3\text{-}20}$ aromatic ring substituted with at least one substituent selected from the group consisting of $C_{1\text{-}6}$ alkyl, halogen and cyano,
$R_2$ and $R_3$ are each independently hydrogen, halogen, cyano, unsubstituted $C_{1\text{-}6}$ alkyl, $C_{1\text{-}6}$ alkyl substituted with at least one substituent selected from the group consisting of $C_{1-6}$ alkyl, halogen and cyano, unsubstituted $C_{3-20}$ aromatic ring, or $C_{3-20}$ aromatic ring substituted with at least one substituent selected from the group consisting of $C_{1-6}$ alkyl, halogen and cyano, $R_4$ is $C_{1-6}$ alkyl, halogen or cyano, $n_1$ is an integer, $n_1 \geq 1$, $n_2$ is 0, 1, 2, 3 or 4, unit B is represented by formula (2),

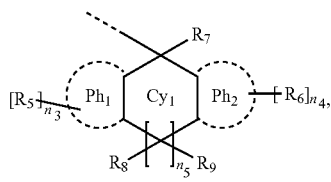

formula (2)

Cyclic $Cy_1$ is a $C_{5-6}$ alicyclic compound, $Ph_1$ and $Ph_2$ are each independently $C_{6-10}$ aromatic hydro carbon rings, which individually compose adjacent 2 carbons in cyclic $Cy_1$, $R_5$ and $R_6$ are each independently hydrogen, halogen, cyano, unsubstituted $C_{1-6}$ alkyl, or $C_{1-6}$ alkyl substituted with at least one substituent selected from halogen and cyano, the broken straight line is a direct bond bonding to the other portion of the ethynyl derived composite, $R_7$, $R_8$ and $R_9$ are each independently hydrogen, unsubstituted $C_{1-6}$ alkyl, $C_{1-6}$ alkyl substituted with at least one substituent selected from halogen or cyano, unsubstituted $C_{6-16}$ aromatic hydro carbon, $C_{6-16}$ aromatic hydro carbon substituted with at least one substituent selected from halogen or cyano, unsubstituted $C_{1-6}$ alkylene linking to the other portion of the ethynyl derived composite, $C_{1-6}$ alkylene substituted with at least one substituent selected from halogen or cyano linking to the other portion of the ethynyl derived composite, or a direct bond bonding to the other portion of the ethynyl derived composite, $n_3$ and $n_4$ are each independently 0, 1, 2, 3 or 4, and $n_5$ is 0 or 1.

A composition comprises the ethynyl derived composite and solvent

A resist underlayer forming composition consists of the composition.

A method for manufacturing a coating, comprises applying a layer of the composition above a substrate, and curing the layer to form the coating. "above a substrate" comprise the applied layer may be formed on the substrate direct contact with, and interlayer may interpose between the substrate and the applied layer.

A method for manufacturing a devise, comprises forming the coating from the composition, forming a layer of a photoresist composition above the coating, curing the photoresist composition to form a photoresist layer, exposing the substrate coated with the photoresist layer, developing the exposed substrate to form a resist pattern, etching with the resist pattern as a mask, and processing the substrate. "above the coating" comprises the formed layer of photoresist composition may be formed on the coating from the composition direct contact with, and interlayer may interpose between the formed layer of photoresist composition and the coating from the composition.

Effects of the Invention

The composites of the present invention can have good heat resistance. The coatings made from the compositions of the present invention can have also good heat resistance. The weight loss and film thickness shrinkage can be decreased for example heated after films formed. And those composition can be filled in gaps into substrate even if it is not-flat. And the surfaces of the coatings made from the compositions can be planarized well.

DESCRIPTION OF EMBODIMENTS

Figure 1:
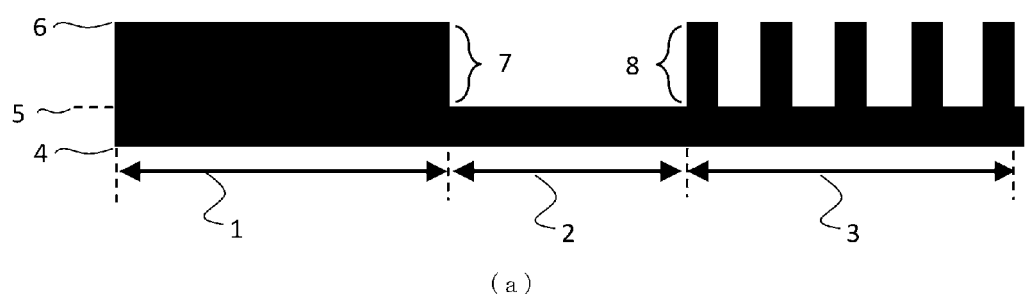
FIG. 1 is an explanatory drawing of a substrate structure used for planarization evaluation.

The above summary and the following details are provided for illustration of the present invention, and are not intended to limit the claimed invention.

Definitions

Herein later in this specification, below defined symbols, units, abbreviations and terms mean below, unless explicitly limited or stated.

When a numerical range is specified herein using "-", "to" or "~", the numerical range includes both of the numbers indicated before and after "-" or "~" and the unit is the same for the two numbers. For example, "5-25 mol %" means "5 mol % or more and 25 mol % or less".

The terms such as "$C_{x-y}$", "$C_x$-$C_y$", and "$C_x$" as used herein represent the number of carbon atoms in a molecule or substituent. For example, "$C_{1-6}$ alkyl" refers to an alkyl chain having 1-6 carbon atoms (such as methyl, ethyl, propyl, butyl, pentyl, and hexyl).

When a polymer as described herein has plural types of repeating units, these repeating units are copolymerized. The copolymerization may be any one selected from alternating copolymerization, random copolymerization, block copolymerization, graft copolymerization, and any combination of any of these. When polymer or resin is represented by chemical structure or formula, n, m and so on put beside brackets means repeating number.

The unit of temperatures as indicated herein is degree Celsius. For example, "20 degrees" means "20 degrees Celsius".

Ethynyl Derived Composites

This invention provides an ethynyl derived composite comprising unit A and unit B. This ethynyl derived composite according to the invention may comprise one or plural unit A(s) and one or plural unit B(s). For example, this composite can be polymer.

Unit A is represented by formula (1).

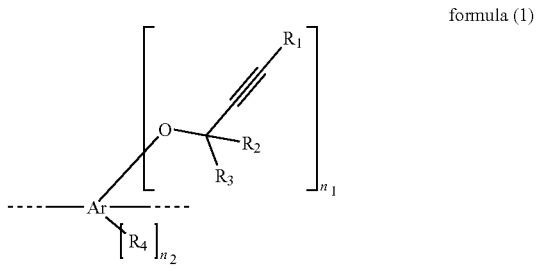

formula (1)

Ar is independently $C_{6-41}$ aromatic hydrocarbon ring. Ar is preferably phenyl, naphthyl, fluorene, anthracene, 9,9- diphenylfluorene, 9,9-dinaphthylfluorene, phenanthrene, perylene or chrysene. More preferably, Ar is phenyl, naphthyl, fluorene, phenanthrene, perylene, or 9,9-diphenylfluorene. Further more preferably, Ar is phenyl, naphthyl, or 9,9-diphenylfluorene.

$R_1$ is independently hydrogen, halogen, cyano, unsubstituted $C_{1-6}$ alkyl (which can be linear or branched alkyl, herein later same unless explicitly limited or stated), $C_{1-6}$ alkyl substituted with at least one substituent selected from the group consisting of $C_{1-6}$ alkyl, halogen and cyano, unsubstituted $C_{3-20}$ aromatic ring, or $C_{3-20}$ aromatic ring substituted with at least one substituent selected from the group consisting of $C_{1-6}$ alkyl, halogen and cyano. Preferably $R_1$ is hydrogen, methyl, ethyl, isopropyl, butyl, phenyl, naphthyl, pyrrol, furan, thiophene, imidazole, pyrazole, pyridine, pyrimidine, pyrazine, fluorine, or cyano. More preferably $R_1$ is hydrogen, methyl, ethyl, isopropyl, butyl, phenyl, naphthyl, fluorine, or cyano. Further preferably $R_1$ is hydrogen, methyl, butyl, phenyl, fluorine, or cyano. Further more preferably $R_1$ is hydrogen. Substituents substituting $C_{1-6}$ alkyl and $C_{3-20}$ aromatic ring of $R_1$ are preferably methyl, ethyl, isopropyl, butyl, fluorine, or cyano, more preferably methyl, fluorine, or cyano. One preferred embodiment of this invention is that each of $R_1$ is not substituted.

$R_2$ and $R_3$ are each independently hydrogen, halogen, cyano, unsubstituted $C_{1-6}$ alkyl, $C_{1-6}$ alkyl substituted with at least one substituent selected from the group consisting of $C_{1-6}$ alkyl, halogen and cyano, unsubstituted $C_{3-20}$ aromatic ring (preferably aromatic hydro carbon ring or heterocyclic ring), or $C_{3-20}$ aromatic ring (preferably aromatic hydro carbon ring or heterocyclic ring) substituted with at least one substituent selected from the group consisting of $C_{1-6}$ alkyl, halogen and cyano. Preferably $R_2$ and $R_3$ are hydrogen, methyl, ethyl, isopropyl, butyl, phenyl, naphthyl, pyrrol, furan, thiophene, imidazole, pyrazole, pyridine, pyrimidine, pyrazine, fluorine, or cyano. More preferably $R_2$ and $R_3$ are hydrogen, methyl, ethyl, isopropyl, butyl, phenyl, naphthyl, fluorine, or cyano. Further preferably $R_2$ and $R_3$ are hydrogen, methyl, butyl, phenyl, fluorine, or cyano. Further more preferably $R_2$ and $R_3$ are hydrogen. Substituents substituting $C_{1-6}$ alkyl and $C_{3-20}$ aromatic ring of $R_2$ and $R_3$ are preferably methyl, ethyl, isopropyl, butyl, fluorine, or cyano, more preferably methyl, fluorine, or cyano. One preferred embodiment of this invention is that each of $R_2$ and $R_3$ are not substituted.

$R_4$ is independently $C_{1-6}$ alkyl, halogen or cyano. Preferably $R_4$ is methyl, ethyl, isopropyl, butyl, fluorine, or cyano. More preferably $R_4$ is methyl, butyl, fluorine, or cyano.

$n_1$ is an integer and $n_1$ 1. Preferably $n_1$ is 1, 2, 3 or 4. More preferably $n_1$ is 1 or 2.

$n_2$ is 0, 1, 2, 3 or 4. Preferably $n_2$ is 0, 1 or 2. More preferably $n_2$ is 0.

Unit B is represented by formula (2).

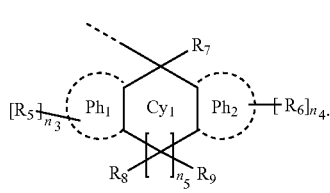

formula (2)

Cyclic $Cy_1$ is a $C_5$-6 alicyclic compound (cyclopentane or cyclohexane). In one embodiment, the combination of $Ph_1$-$Cy_1$-$Ph_2$ exhibits aromatic properties. In the case the portion of formula (2) unit is replaced by a fused aromatic ring (e.g., pyrene), it is assumed that a solubility of the whole component will be worse.

$Ph_1$ and $Ph_2$ are each independently $C_{6-10}$ aromatic hydro carbon rings, which individually compose adjacent 2 carbons in cyclic $Cy_1$. Preferably $Ph_1$ and $Ph_2$ are each independently phenyl or naphthyl. More preferably $Ph_1$ and $Ph_2$ are phenyl. For example, in the case that cyclic $Cy_1$ is cyclopentane, $Ph_1$ and $Ph_2$ are phenyl, combination of cyclic $Cy_1$, $Ph_1$ and $Ph_2$ means fluorene.

$R_5$ and $R_6$ are each independently hydrogen, halogen, cyano, unsubstituted $C_{1-6}$ alkyl, or $C_{1-6}$ alkyl substituted with at least one substituent selected from halogen (preferably fluorine) and cyano. Preferably $R_5$ and $R_6$ are independently methyl, ethyl, isopropyl, butyl, fluorine, or cyano. More preferably $R_5$ and $R_6$ are independently methyl, butyl, fluorine, or cyano. One preferred embodiment of this invention is that each of $R_5$ and $R_6$ are not substituted.

The broken straight line is a direct bond bonding to the other portion of the ethynyl derived composite. In here, the "the other portion of the ethynyl derived composite" doesn't comprise 1 unit B which the broken straight line comes out from. But in the case that ethynyl derived composite according to the invention comprise plural unit Bs, the broken straight line can bond to other unit B (not unit B which the broken straight line comes out from). The broken straight line does not bond to $R_1$, $R_2$ or $R_3$.

$R_7$, $R_8$ and $R_9$ are each independently hydrogen, unsubstituted $C_{1-6}$ alkyl, $C_{1-6}$ alkyl substituted with at least one substituent selected from halogen (preferably fluorine) or cyano, unsubstituted $C_{6-16}$ aromatic hydro carbon, $C_{6-16}$ aromatic hydro carbon substituted with at least one substituent selected from halogen (preferably fluorine) or cyano, unsubstituted $C_{1-6}$ alkylene linking to the other portion of the ethynyl derived composite, $C_{1-6}$ alkylene substituted with at least one substituent selected from halogen (preferably fluorine) or cyano linking to the other portion of the ethynyl derived composite, or a direct bond bonding to the other portion of the ethynyl derived composite. Preferable embodiments of above $C_{1-6}$ alkyl of $R_7$, $R_8$ and $R_9$ are independently methyl, ethyl, isopropyl, butyl, more preferably methyl or butyl. Preferable embodiments of above $C_{6-16}$ aromatic hydro carbon of $R_7$, $R_8$ and $R_9$ are independently phenyl, naphthyl, anthracenyl, phenanthrenyl or pyrenyl. Preferable embodiments of $C_{1-6}$ alkylene are methylene, ethylene, isopropylene, butylene, more preferably methylene or butylene. In here, the "the other portion of the ethynyl derived composite" doesn't comprise 1 unit B which the $R_7$, $R_8$ and $R_9$ exist in. But in the case that ethynyl derived composite according to the invention comprise plural unit Bs, $R_7$, $R_8$ or $R_9$ can bond to other unit B (not unit B which they exist in). $R_7$, $R_8$ or $R_9$ does not bond to $R_1$, $R_2$ or $R_3$.

Preferable embodiment of $R_7$, $R_8$ and $R_9$ are each independently unsubstituted $C_{6-16}$ aromatic hydro carbon, $C_{6-16}$ aromatic hydro carbon substituted with at least one substituent selected from halogen or cyano, unsubstituted $C_{1-6}$ alkylene linking to the other portion of the ethynyl derived composite, $C_{1-6}$ alkylene substituted with at least one substituent selected from halogen or cyano linking to the other portion of the ethynyl derived composite, or a direct bond bonding to the other portion of the ethynyl derived composite. More preferable embodiment of are $R_7$, $R_8$ and $R_9$ phenyl, naphthyl, methylene linking to the other portion of the ethynyl derived composite or a direct bond bonding to the other portion of the ethynyl derived composite, further preferably phenyl or a direct bond bonding to the other portion of the ethynyl derived composite. One preferred embodiment of this invention is that each of $R_7$, $R_8$ and $R_9$ are not substituted.

$n_3$ and $n_4$ are each independently 0, 1, 2, 3 or 4. Preferably $n_3$ and $n_4$ are each independently 0, 1, or 2. More preferably $n_3$ and $n_4$ are each independently 0 or 1. Further preferably $n_3$ and $n_4$ are 0.

$n_5$ is 0 or 1. Preferably $n_5$ is 0.

Unit A represented by formula (1) is preferably represented by below formula (1)'.

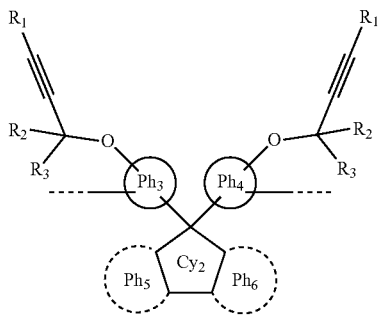

formula (1)'

Cyclic $Cy_2$ is cyclopentane.

$Ph_3$ and $Ph_4$ are each independently $C_{6-10}$ aromatic hydro carbon rings. Preferably, $Ph_3$ and $Ph_4$ are each independently phenyl or naphthyl. More preferably, $Ph_3$ and $Ph_4$ are phenyl.

$Ph_5$ and $Ph_6$ are each independently $C_{6-10}$ aromatic hydro carbon rings, which individually compose adjacent 2 carbons in cyclic $Cy_2$. Preferably $Ph_5$ and $Ph_6$ are each independently phenyl or naphthyl. More preferably $Ph_5$ and $Ph_6$ are phenyl.

Definitions and preferable embodiments of $R_1$, $R_2$ and $R_3$ in formula (1)' are each independently same to described as above.

For example, the below left compound is a ethynyl derived composite consisting of 1 unit A and 1 unit B. The below left compound can be construed as Ar is 9,9-diphenylfluorene, $R_1$, $R_2$ and $R_3$ are hydrogen, $n_1$=2, $n_2$=0 in formula (1). As shown in below right, 1 bonding indicated by arrow is not used to bond to other unit. And the below left compound can be construed as cyclic $Cy_1$ is a $C_5$ alicyclic compound, $Ph_1$ and $Ph_2$ are phenyl, $R_7$ is phenyl, and $n_3$, $n_4$ and $n_5$ are 0 in formula (2). Because $n_5$ is 0, $R_8$ and $R_9$ don't exist. The broken straight line in formula (2) bonds to Ar (9,9-diphenylfluorene) in unit A.

For example, the below compound is a ethynyl derived composite consisting of 2 unit As and 2 unit Bs. The below compound can be construed as Ar are naphthyl, $R_1$, $R_2$ and $R_3$ are hydrogen, $n_1$=1, $n_2$=0 in formula (1). And it can be construed as cyclic $Cy_1$ are $C_5$ alicyclic compounds, $Ph_1$ and $Ph_2$ are phenyl, one $R_7$ is phenyl and the other $R_7$ is a direct bond bonding to the other portion (Ar in formula (1)) of the ethynyl derived composite, and $n_3$, $n_4$ and $n_5$ are 0 in formula (2). It can be construed as the broken straight lines in formula (2) bond to the other portion (Ar in formula (1)) of the ethynyl derived composite.

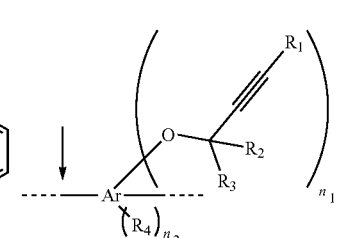

For example, the below compound is a ethynyl derived composite consisting of 2 unit As and 2 unit Bs. The below compound can be construed as Ar are naphthyl, $R_1$, $R_2$ and $R_3$ are hydrogen, $n_1$=1, $n_2$=0 in formula (1). And it can be construed as cyclic $C_1$ are $C_5$ alicyclic compounds, $P_1$ and $P_2$ are phenyl, $R_7$ are a direct bond bonding to the other portion (each $R_7$ bonds to the other $R_7$ in the other unit B) of the

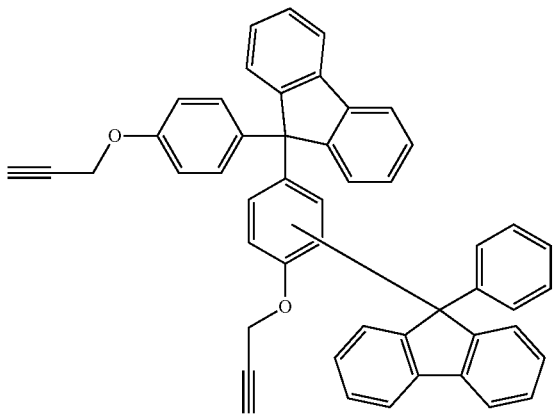

ethynyl derived composite, and $n_3$, $n_4$ and $n_5$ are 0 in formula (2). It can be construed as the broken straight lines in formula (2) bond to the other portion (Ar in formula (1)) of the ethynyl derived composite.

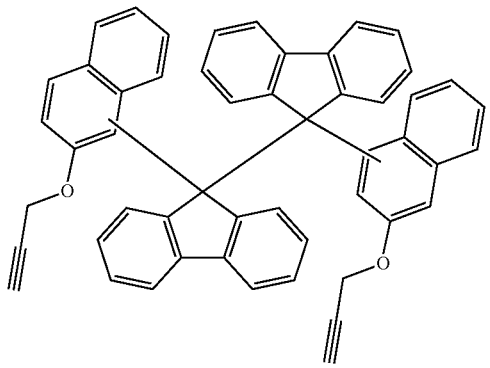

One preferable embodiment of the ethynyl derived composite according to the invention is described below.

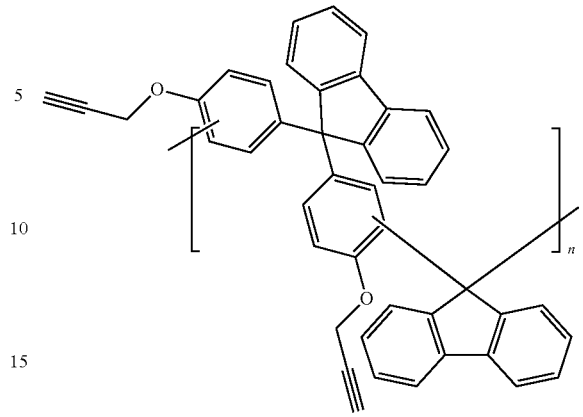

In the above structure, n means repeating number (same in herein later). When the ethynyl derived composite is polymer (dimer is included), alternating copolymerization is preferable one embodiment.

For understanding, exemplified embodiments of the ethynyl derived composites are described below. Those are only for illustrative purpose, and there is no intent to limit the scope of these inventions.

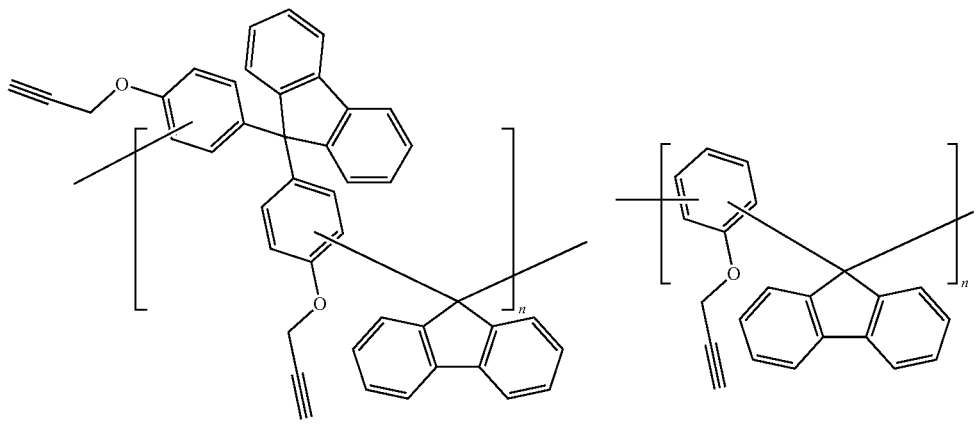

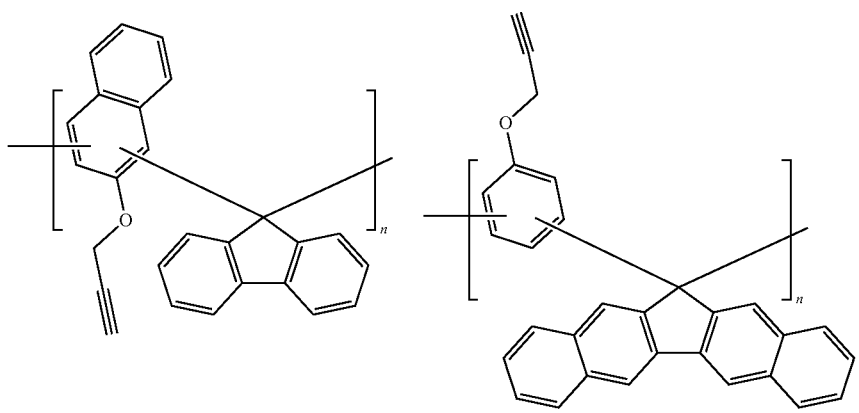

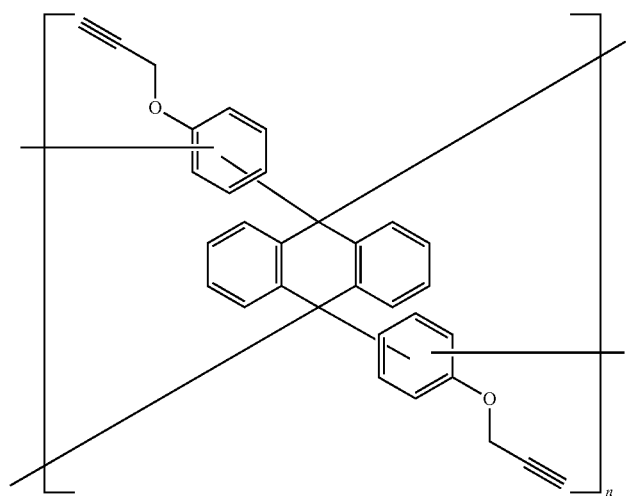
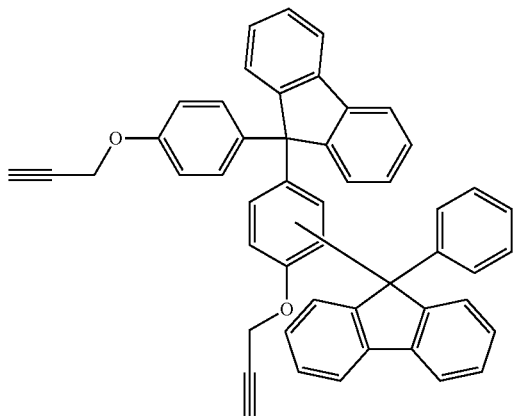
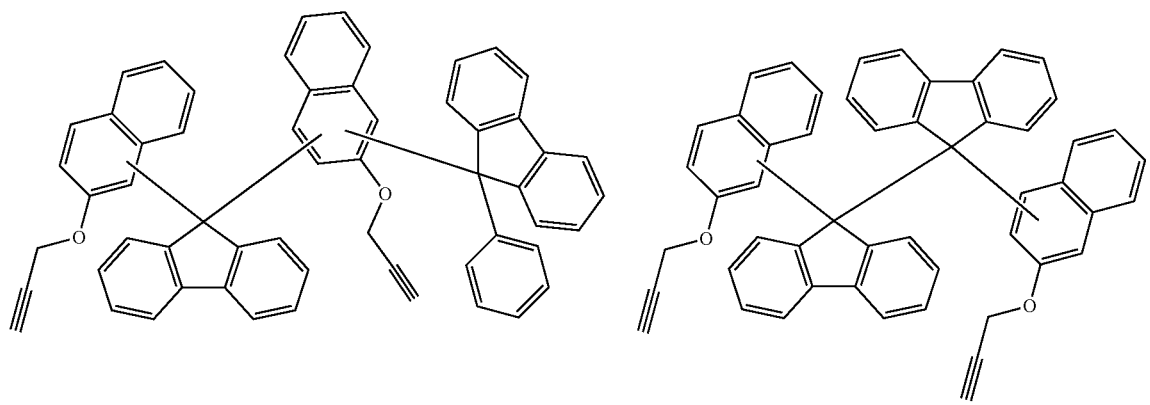
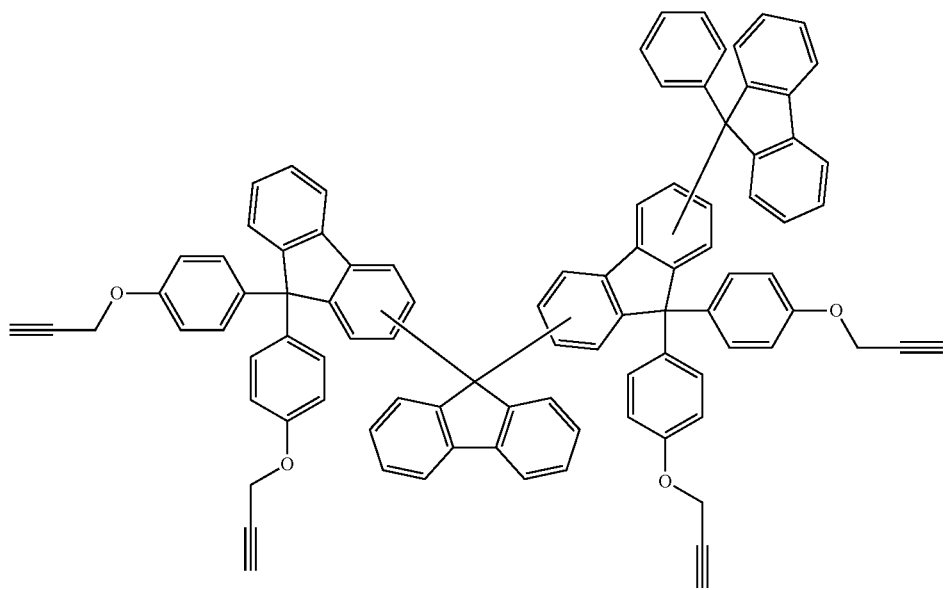

-continued
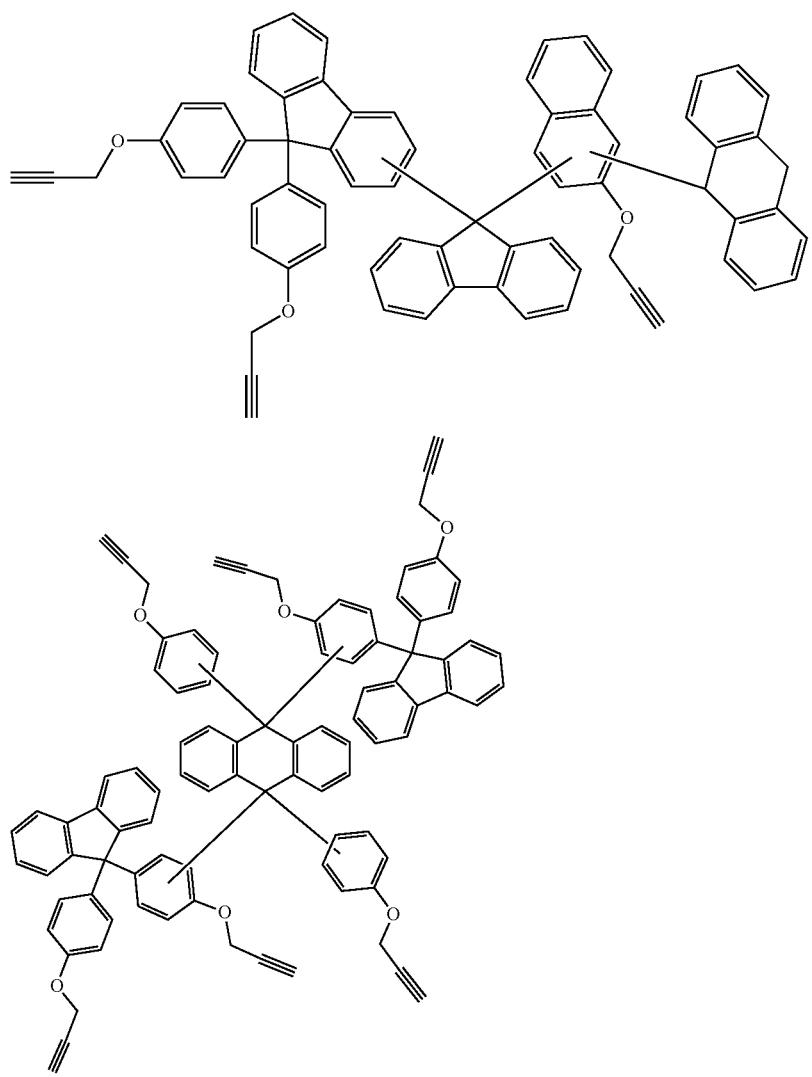
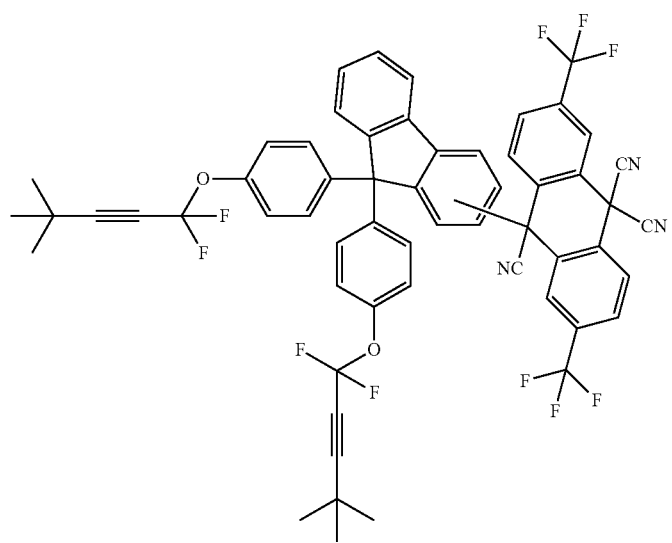

-continued
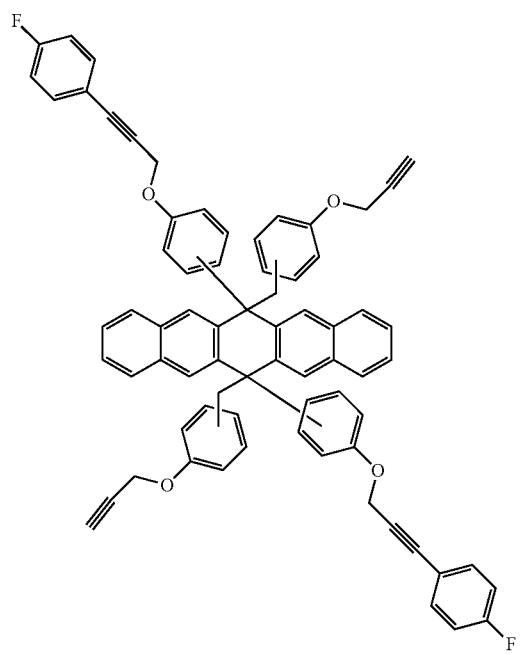
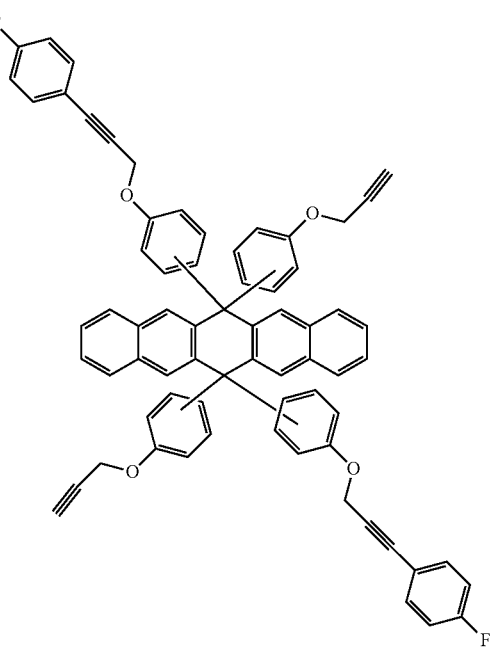
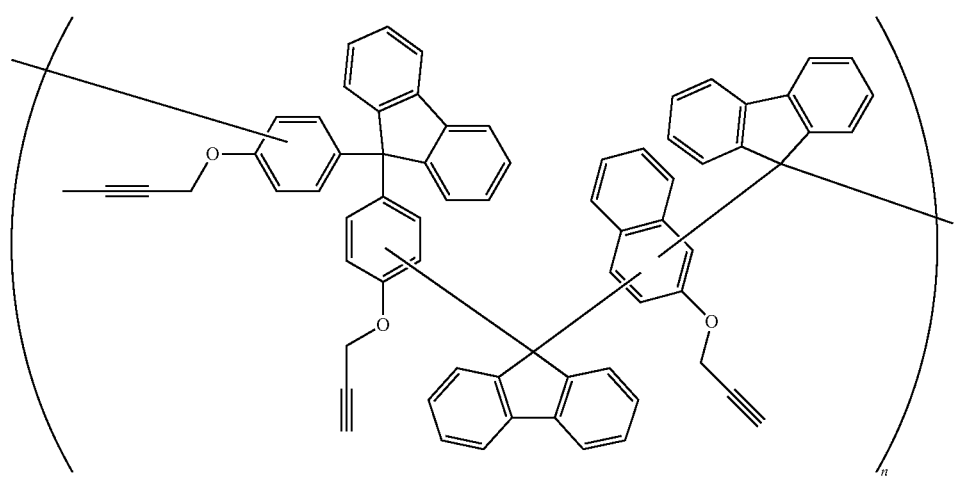
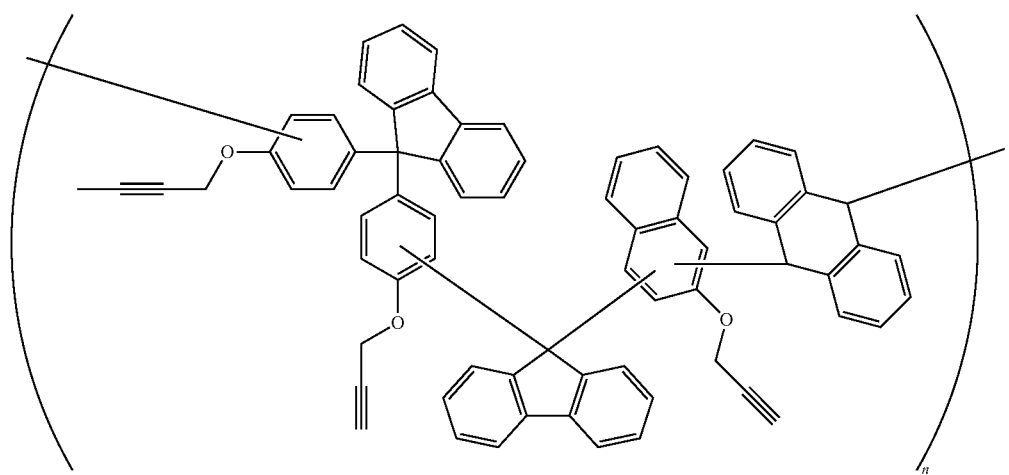

-continued
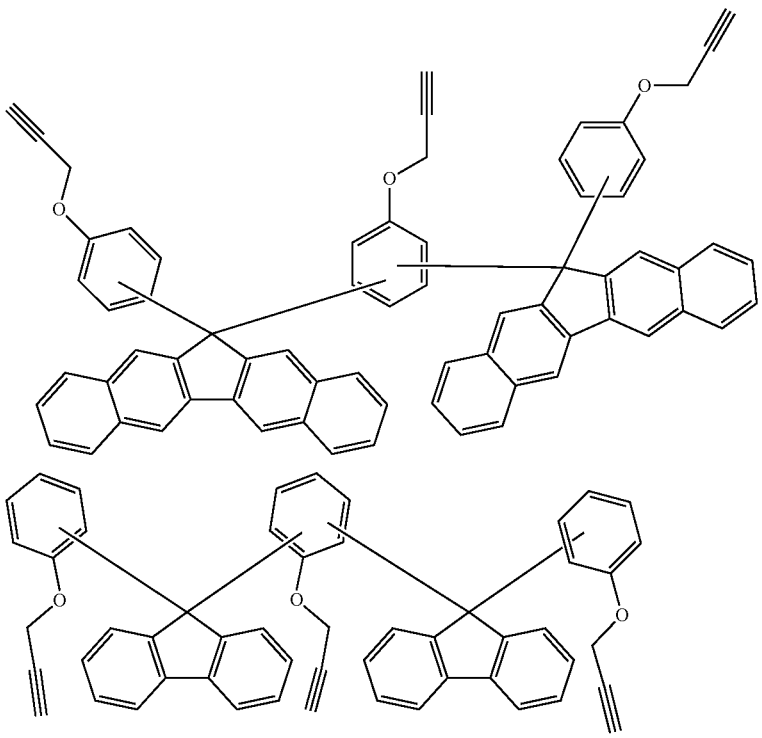
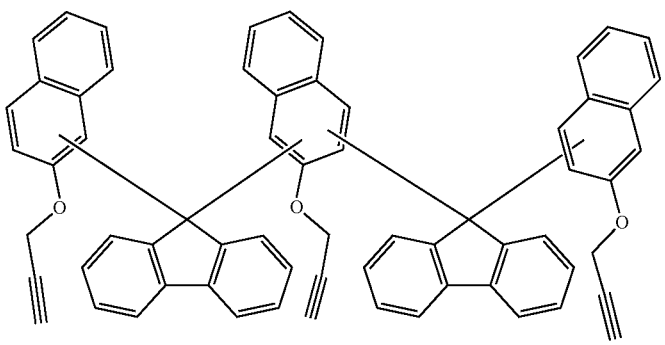
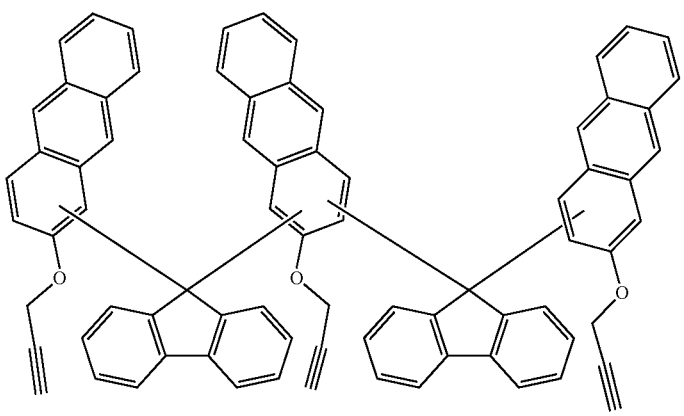

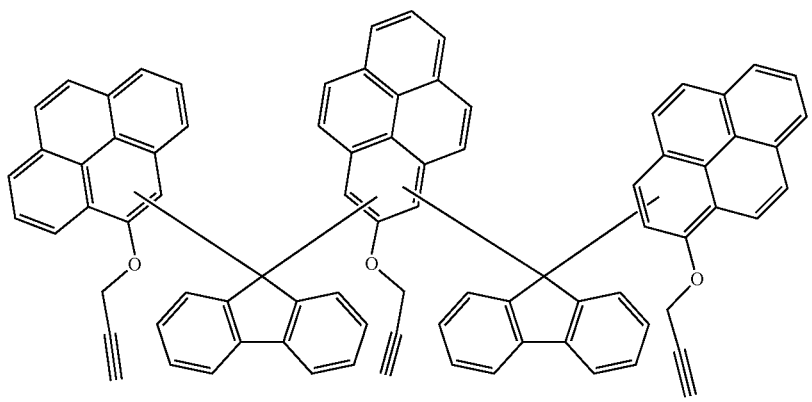
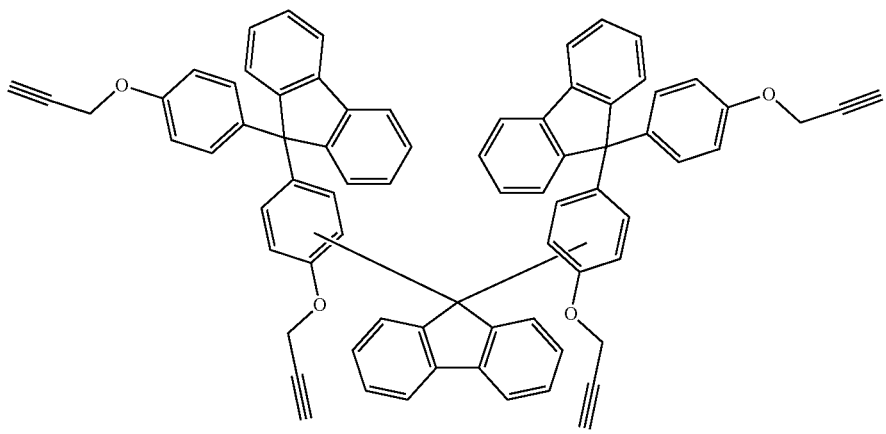
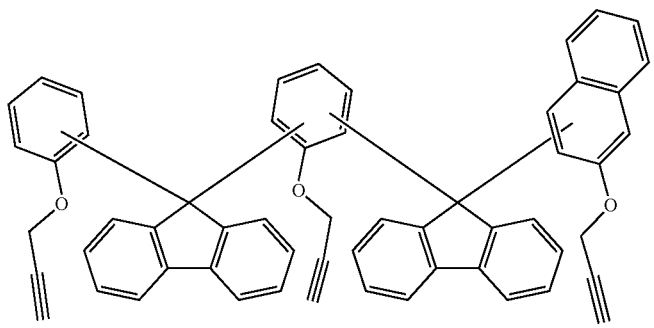
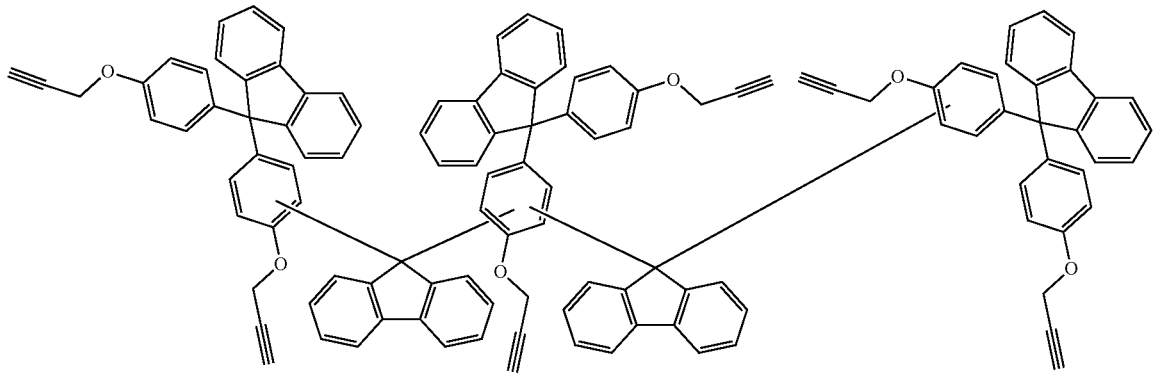

-continued
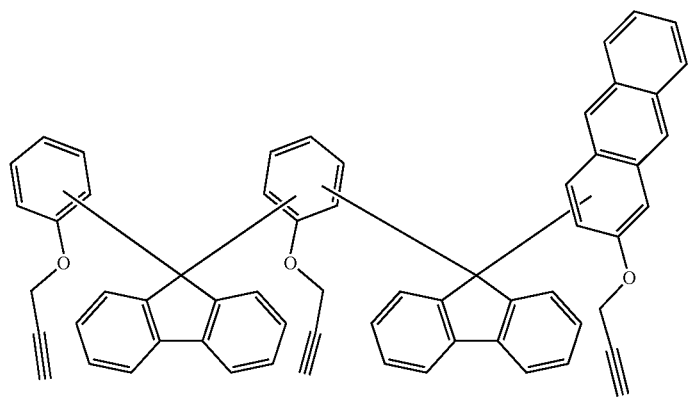
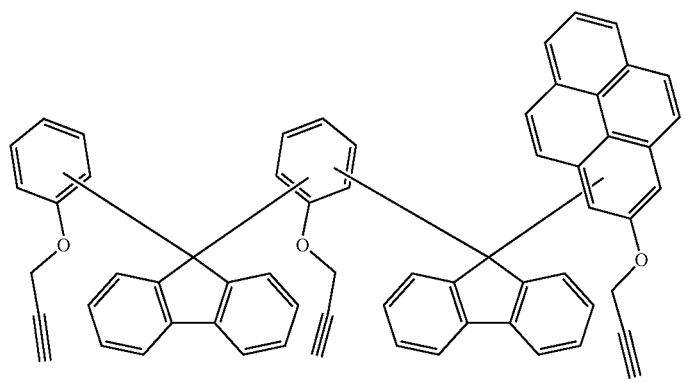
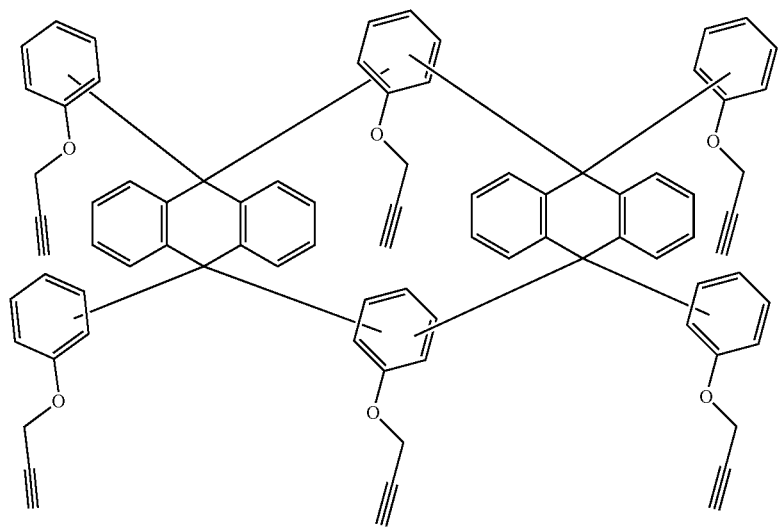

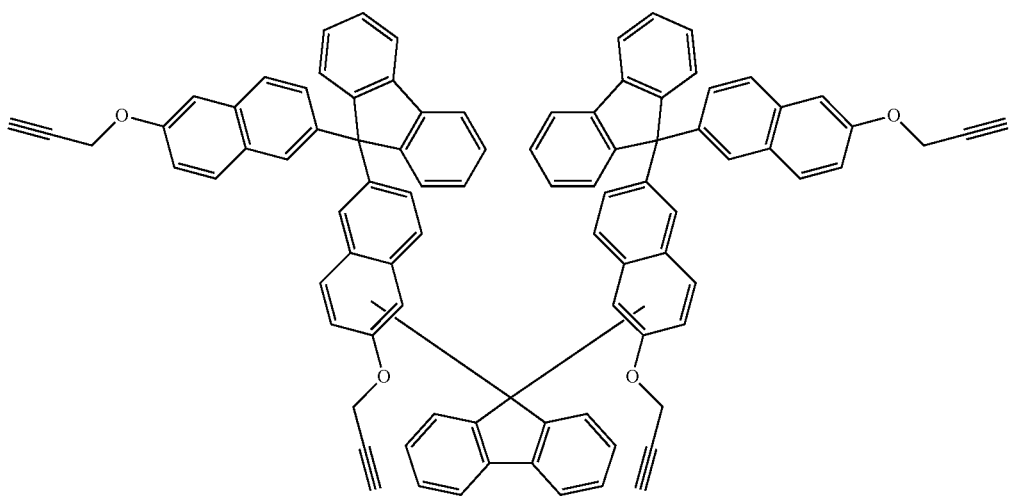
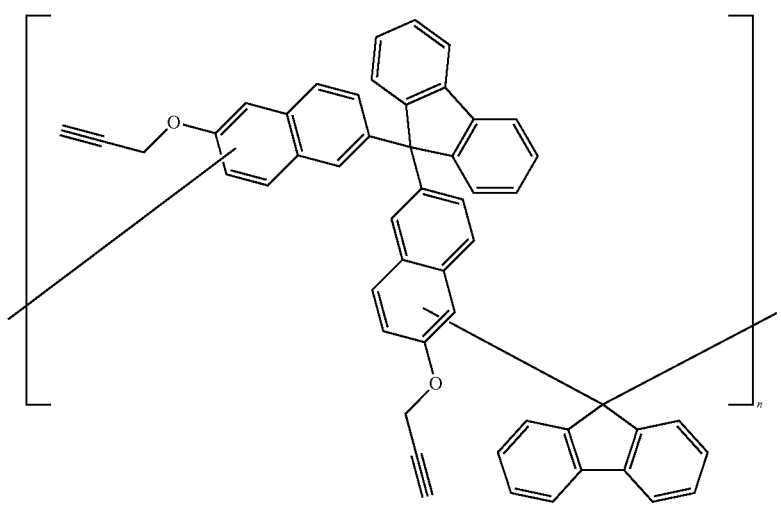
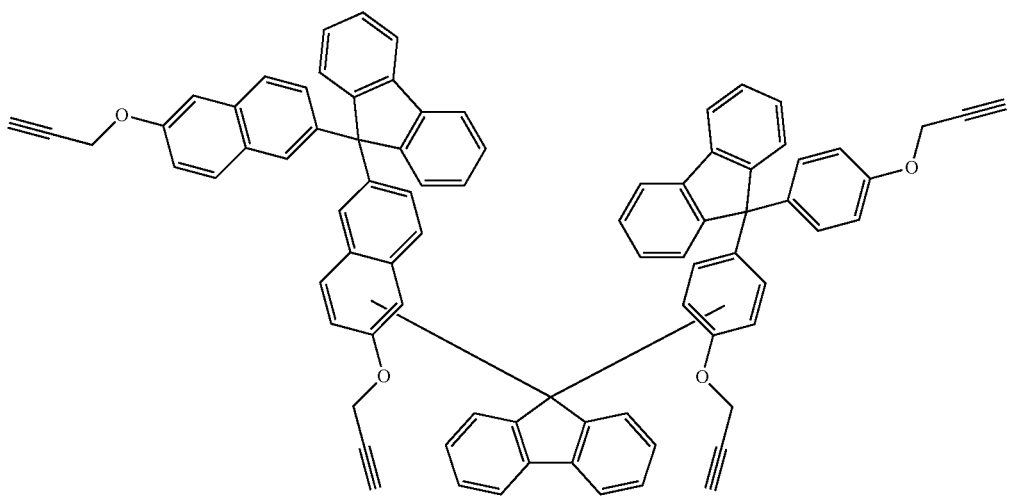

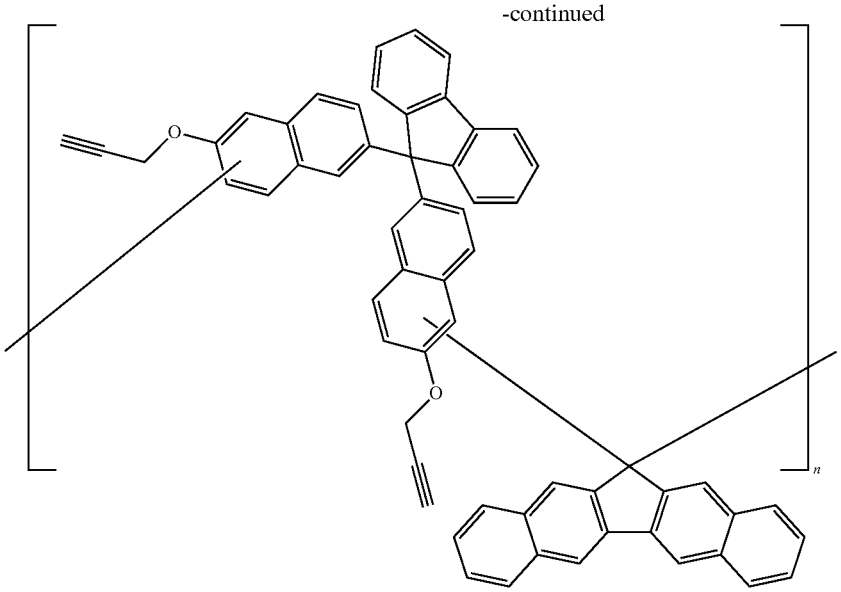

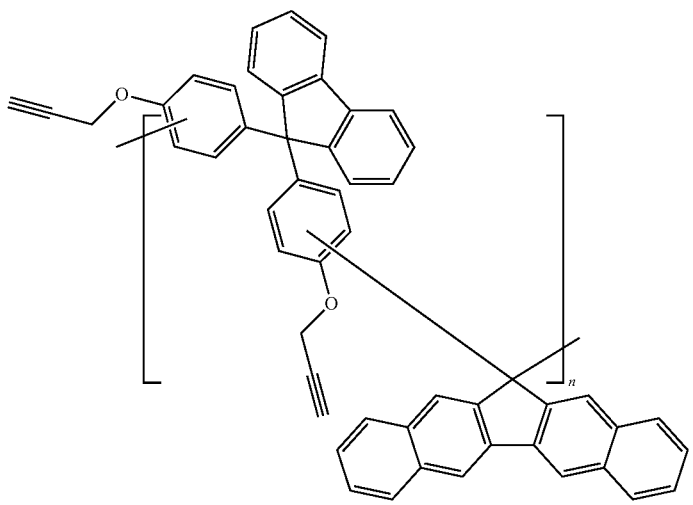

The unit A concentration compared to the whole units in one ethynyl derived composite according to the invention is preferably 30-70 mol %, more preferably 40-60 mol %, further preferably 45-55 mol %. And, the unit B concentration compared to the whole units in one ethynyl derived composite according to the invention is preferably 30-70 mol %, more preferably 40-60 mol %, further preferably 45-55 mol %. One embodiment of a ethynyl derived composite according to the invention can comprise units other than unit A or B. It is preferable embodiment that mol ratio of unit A and unit B in the ethynyl derived composite is 60:40-40:60, more preferably 90:110-110:90, further preferably 100:100.

It is preferable that the ethynyl derived composite comprises the unit A as an end group. Such embodiments of the invention have a tendency to be more stable than others.

In addition, when the ethynyl derived composite is a polymer, it is preferable that none or few secondary carbon atom and the tertiary carbon atom are contained in the main chain of the polymer from the viewpoint of increasing the heat resistance of the layer to be formed from the composition including the ethynyl derived composite. In one embodiment of the present invention, the ethynyl derived composite is a polymer, and when synthesizing the polymer, the amount of the aldehyde derivative (formaldehyde or the like) is preferably 0-30 mol %, more preferably 0-15 mol %, further preferably 0-5 mol %, and still more preferably 0 mol %, based on all the components to be used for the synthesis. In order to obtain a polymer, in the main chain of which none or few of secondary carbon atom and tertiary carbon atom is contained, it is one of the preferred embodiments of the present invention to use a ketone derivative.

The present invention provides an electric material comprising (preferably consisting of) the ethynyl derived composite of present invention. The term "electric material" as used in the present invention refers to a material used in an electric device manufacturing process. In a preferred aspect of the present invention, the electric material is used in a coating or layer that does not remain in the electric device as a final product.

And the present invention provides a semiconductor material comprising (preferably consisting of) the ethynyl derived composite of present invention. The term "semiconductor material" as used in the present invention refers to a material used in a semiconductor device manufacturing process. Namely, this term is intended to include, for example, a material forming a coating or layer such as a photoresist coating or underlayer which is removed in the course of a manufacturing process of a circuit. In a preferred aspect of the present invention, the semiconductor material is used in a coating or layer that doses not remain in the semiconductor device as a final product.

It is desirable that the electric material and semiconductor material used as a raw material have an impurity content of 2% or less, preferably 1% or less, more preferably 0.1% or less, further preferably 0.01% or less. Examples of impurities include a starting material for the synthesis process and a precursor remaining unreacted. When the electric material or semiconductor material is contained in a composition, the term "impurity content" is used to refer to the amount of impurities relative to the amount of the electric material or semiconductor material, and the preferred range of the impurity content is as indicated above.

Method for Synthesizing Ethynyl Derived Composites

Detailed procedures of the method for synthesis of the ethynyl derived composites according to the invention are as described in Synthesis Examples given below. Known methods can be combined with them to obtain the ethynyl derived composites. Precursors can be obtained as described on Patent Literature 2. And the ethynyl derived composites can be obtained by replacing a hydroxyl group(s) with an ethynyl derived group(s). The below procedure for the syntheses of ethynyl derived composites is one embodiment of the invention.

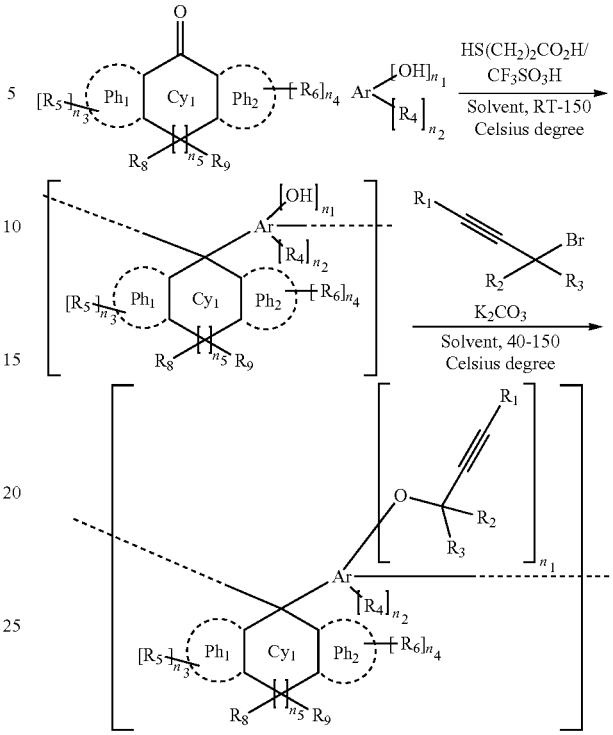

Composition

This invention provide a composition comprising an ethynyl derived composite according to the invention and a solvent. As long as the ethynyl derived composites comprises unit A and unit B described above, the composition according to the invention can comprise plural types of ethynyl derived composites. It is not necessary to limit the number and/or types of unit A and/or unit B. Mixtures of the ethynyl derived composites are acceptable for this invention scope. As described below for understanding purpose, it is possible that the composition comprises 2 different ethynyl derived composites, one ethynyl derived composite has 1 unit A and 1 unit B, and the other ethynyl derived composite has 2 unit A and 2 unit B.

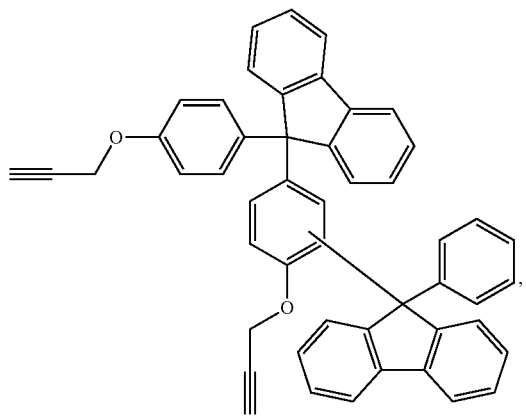

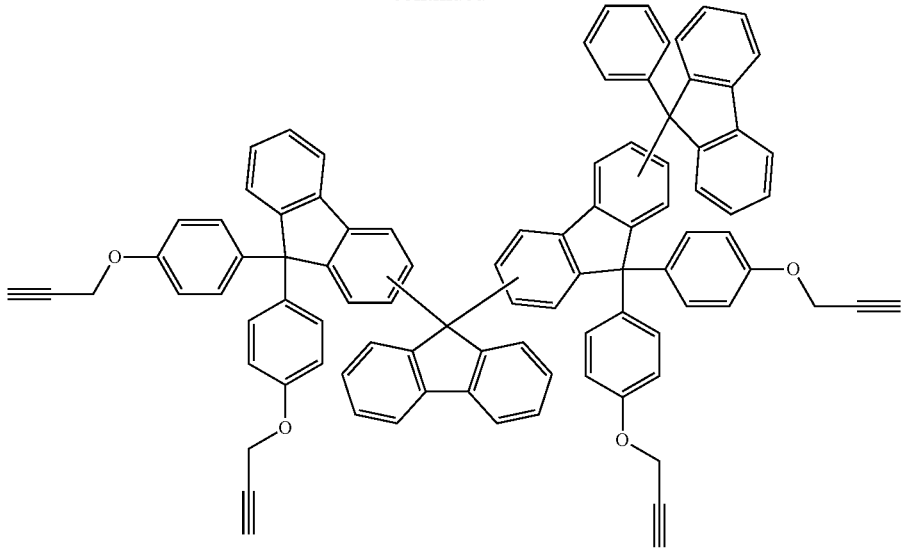

When a combination of the above compounds is used, these compounds may be bonded to each other or reacted independently of each other during coating formation.

The amount of the ethynyl derived composite is preferably 2-60 mass %, more preferably 2-30 mass %, further preferably 2-20 mass %, and further more preferably 3-10 mass % relative to the total amount of the composition. Increasing the amount of the solid component relative to the total amount of the composition allows formation of a thick coating.

Solid Component Other than Ethynyl Derived Composites

The composition according to the invention may further comprise a solid component(s) that is other than the ethynyl derived composites, and that is formed into a coating. The other solid component may be a low-molecular-weight compound or a polymer. When formed into a coating, the other solid component may be bonded to an ethynyl derived composite according to the invention or may be reacted independently of the ethynyl derived composite. And those states can exist in one composition as mixed.

It is one preferable embodiment of this invention that atoms in a single or a plurality of solid components in the composition satisfy below formula (3).

1.5≤{total number of atoms/(number of C−number of O)}≤3.5    formula (3)

The number of C is the number of carbon atoms in the total number of atoms. The number of O is the number of oxygen atoms in the total number of atoms. The total number of atoms in formula (3) includes the number of hydrogen atoms.

The composition according to the invention can consist of an ethynyl derived composite(s), and can comprise an ethynyl derived composite(s) and other solid component. It can be said as above solid components comprise the ethynyl derived composite(s). For higher etching resistance, It is preferable that the carbon amount is large comprised in the composition according to the invention.

Formula (3) is preferably formula 3)' or formula (3)".

1.5≤{total number of atoms/(number of C−number of O)}≤2.4    (3)'

1.8≤{total number of atoms/(number of C−number of O)}≤2.4    (3)"

Solvent

The solvent used in the present invention can comprise for example water and organic solvents. And the solvent in the composition according to the invention can comprise at least one solvent selected from the group consisting of water, hydrocarbon solvents, ether solvents, ester solvents, alcohol solvents, and ketone solvents.

Examples of the organic solvents include: aliphatic hydrocarbon solvents such as n-pentane, i-pentane, n-hexane, i-hexane, n-heptane, i-heptane, cyclohexane, and methylcyclohexane; aromatic hydrocarbon solvents such as benzene, toluene, xylene, ethylbenzene, trimethylbenzene, methylethylbenzene, n-propylbenzene, i-propylbenzene, diethylbenzene, and i-butylbenzene, monoalcohol solvents such as methanol, ethanol, n-propanol, i-propanol, n-butanol, i-butanol, sec-butanol, t-butanol, n-pentanol, i-pentanol, 2-methylbutanol, 2-ethylhexanol, n-nonyl alcohol, 2,6-dimethylheptanol-4, n-decanol, cyclohexanol, benzyl alcohol, phenylmethylcarbinol, diacetone alcohol, and cresol; polyol solvents such as ethylene glycol, propylene glycol, 1,3-butylene glycol, diethylene glycol, dipropylene glycol, triethylene glycol, tripropylene glycol, and glycerin; ketone solvents such as acetone, methyl ethyl ketone, methyl n-propyl ketone, methyl n-butyl ketone, diethyl ketone, trimethylnonanone, cyclohexanone, cyclopentanone, methylcyclohexanone, 2,4-pentanedione, acetonylacetone, acetophenone, and fenchone; ether solvents such as ethyl ether, i-propyl ether, n-butyl ether, n-hexyl ether, 2-ethylhexyl ether, dimethyldioxane, ethylene glycol monomethyl ether, ethylene glycol monoethyl ether, ethylene glycol diethyl ether, ethylene glycol mono-n-butyl ether, ethylene glycol mono-n-hexyl ether, ethylene glycol monophenyl ether, ethylene glycol mono-2-ethylbutyl ether, ethylene glycol dibutyl ether, diethylene glycol monomethyl ether, diethylene glycol monoethyl ether, diethylene glycol diethyl ether, diethylene glycol mono-n-butyl ether, diethylene glycol di-n-butyl ether, diethylene glycol mono-n-hexyl ether, propylene glycol monomethyl ether (PGME), propylene glycol monoethyl ether, propylene glycol monopropyl ether, propylene glycol monobutyl ether, dipropylene glycol monomethyl ether, dipropylene glycol monoethyl ether, dipropylene glycol monopropyl ether, dipropylene glycol monobutyl ether, tripropylene glycol monomethyl ether, tetrahydrofuran, and 2-methyltetrahydrofuran; ester solvents such as diethyl carbonate, methyl acetate, ethyl acetate, γ-butyrolactone, γ-valerolactone, n-propyl acetate, i-propyl acetate, n-butyl acetate, i-butyl acetate, n-butyl propionate, methyl lactate, ethyl lactate (EL), γ-butyrolactone, n-butyl lactate, n-amyl lactate, diethyl malonate, dimethyl phthalate, diethyl phthalate, propylene glycol 1-monomethyl ether 2-acetate (PGMEA), propylene glycol monoethyl ether acetate, and propylene glycol monopropyl ether acetate; nitrogen-containing solvents such as N-methylformamide; and sulfur-containing solvents such as dimethyl sulfide. Any mixture of any of these solvents can also be used.

In particular, cyclohexanone, cyclopentanone, propylene glycol monomethyl ether, propylene glycol monoethyl ether, propylene glycol monopropyl ether, propylene glycol monobutyl ether, propylene glycol dimethyl ether, propylene glycol diethyl ether, propylene glycol 1-monomethyl ether 2-acetate, propylene glycol monoethyl ether acetate, propylene glycol monopropyl ether acetate, γ-butyrolactone, ethyl lactate, and any mixture of any of these are preferred in terms of the storage stability of the solution.

In terms of the solubility of the solute, propylene glycol monomethyl ether, propylene glycol 1-monomethyl ether 2-acetate, ethyl lactate, and a mixture of any two solvents selected therefrom are preferred. The mixture of two solvents is preferably a mixture in a volume ratio of 10:90 to 90:10 and more preferably a mixture in a volume ratio of 25:75 to 75:25. For some purposes, propylene glycol 1-monomethyl ether 2-acetate is most preferable as solvent.

The amount of the organic solvents (or the total amount of the two or more organic solvents) is preferably 60-98 mass %, more preferably 70-98 mass %, and further preferably 80-98 mass % relative to the total amount of the composition. The solvents preferably comprise an organic solvent, and the amount of water in the composition is preferably 0.1 mass % or less and further preferably 0.01 mass % or less. Given the relationship with another layer or coating, it is preferable for the solvents to be free of water. As one aspect of the present invention, the amount of water in the composition is preferably 0.00 mass %.

Surfactant

The composition according to the invention can comprise an additive, for example a surfactant. A surfactant is useful for decreasing pin hole or striation in a coating made by a composition, and for increasing the coatability and/or solubility of a composition. The amount of the surfactant (or the total amount of the two or more surfactants) is preferably 0-5 mass %, and more preferably 0.1-3 mass % relative to the total amount of the composition. It is also one preferable embodiment of the invention that the composition does not comprise any surfactant (0 mass %).

Examples of the surfactant include: polyoxyethylene alkyl ether compounds such as polyoxyethylene lauryl ether, polyoxyethylene stearyl ether, and polyoxyethylene oleyl ether; polyoxyethylene alkylaryl ether compounds such as polyoxyethylene octylphenol ether and polyoxyethylene nonylphenol ether; polyoxyethylene-polyoxypropylene block copolymer compounds; sorbitan fatty acid ester compounds such as sorbitan monolaurate, sorbitan monopalmitate, sorbitan monostearate, sorbitan trioleate, and sorbitan tristearate; and polyoxyethylene sorbitan fatty acid ester compounds such as polyoxyethylene sorbitan monolaurate, polyoxyethylene sorbitan monopalmitate, polyoxyethylene sorbitan monostearate, and polyoxyethylene sorbitan tristearate. Other examples of the surfactant include: fluorosurfactants such as EFTOP (trade name) EF301, EF303, and EF352 (manufactured by Tohkem Products Corporation), MEGAFACE (trade name) F171, F173, R-08, R-30, and R-2011 (manufactured by DIC Corporation), Fluorad FC430 and FC431 (manufactured by Sumitomo 3M Limited), AsahiGuard (trade name) AG710 (manufactured by Asahi Glass Co., Ltd.), and SURFLON S-382, SC101, SC102, SC103, SC104, SC105, and SC106 (manufactured by Asahi Glass Co., Ltd.); and organosiloxane polymers such as KP341 (manufactured by Shin-Etsu Chemical Co., Ltd.).

Crosslinking Agent

A crosslinking agent can be added for the purpose of improving the coating formation property of the coating to be formed, preventing intermixing with an upper layer (such as a silicon-containing interlayer and a resist), and preventing diffusion of a low-molecular-weight component into the upper layer.

Exemplified embodiments of crosslinking agents that can be used in the present invention include: melamine, guanamine, glycoluril, and urea compounds substituted by at least one group selected from a methylol group, an alkoxymethyl group, and an acyloxymethyl group; epoxy compounds; thioepoxy compounds; isocyanate compounds; azide compounds; and compounds having a double bond-containing group such as an alkenyl ether group. These may be used as an additive or may alternatively be introduced as a pendant group into a polymer side chain. Compounds containing a hydroxy group can also be used as a crosslinking agent.

Examples of the epoxy compounds mentioned above include tris(2,3-epoxypropyl) isocyanurate, trimethylolmethane triglycidyl ether, trimethylolpropane triglycidyl ether, and triethylolethane triglycidyl ether. Exemplified embodiments of the melamine compounds include hexamethylolmelamine, hexamethoxymethylmelamine, and any mixture of any of such compounds. Examples of the guanamine compounds include tetramethylolguanamine, tetramethoxymethylguanamine, and any mixture of any of such compounds, Examples of the glycoluril compounds include tetramethylolglycoluril, tetramethoxyglycoluril, tetramethoxymethylglycoluril, and any mixture of any of such compounds. Examples of the urea compounds include tetramethylolurea, and tetramethoxymethylurea.

Examples of the compounds containing an alkenyl ether group include ethylene glycol divinyl ether, and triethylene glycol divinyl ether.

Examples of the crosslinking agent used present invention include those represented by formula (4).

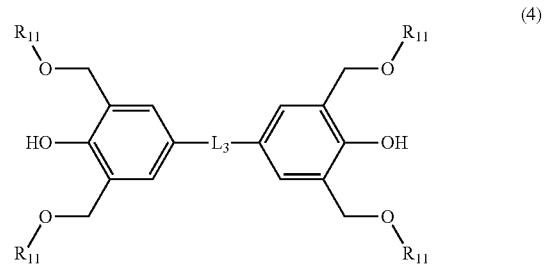

(4)

In formula (4), $L_3$ is a direct bond, substituted or unsubstituted $C_{1-3}$ alkyl, or substituted or unsubstituted $C_{7-16}$ aralkyl. $L_3$ is preferably a direct bond, $C_1$ alkyl, or $C_{15}$ aralkyl. The substituent of the alkyl or aralkyl is preferably hydrogen, methyl, $C_{6-11}$ aryl, or a substituent of formula (5) or formula (6), and more preferably methyl, a substituent of formula (5), or a substituent of formula (6). In a preferred aspect, $L_3$ is unsubstituted $C_{1-3}$ alkyl or unsubstituted $C_{1-3}$ aralkyl.

formula (5)

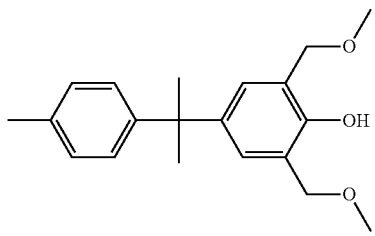

formula (6)

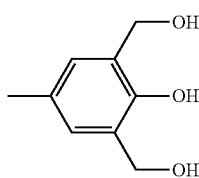

In formula (4), $R_{11}$ is hydrogen or methyl.

The following are exemplified embodiments of the cross-linking agent represented by formula (4). The scope of the present invention is not limited to them.

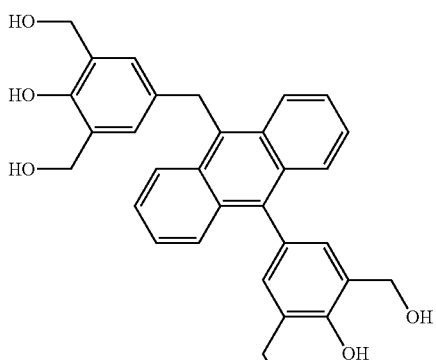

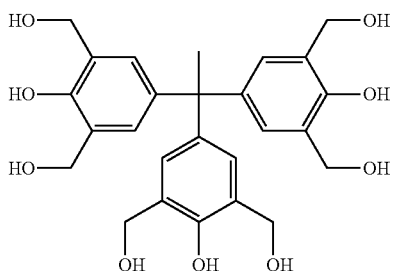

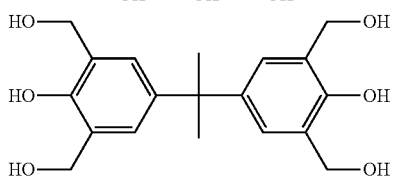

-continued

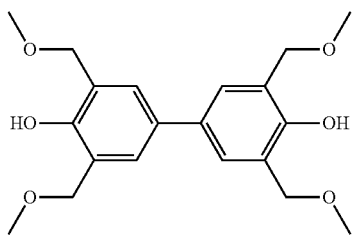

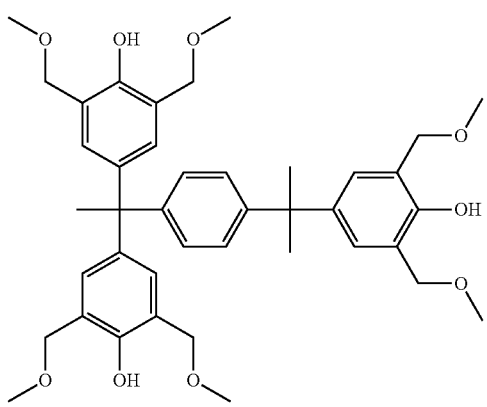

The following are exemplified embodiments of another crosslinking agent that can be contained in the planarizing coating-forming composition. The scope of the present invention is not limited to them.

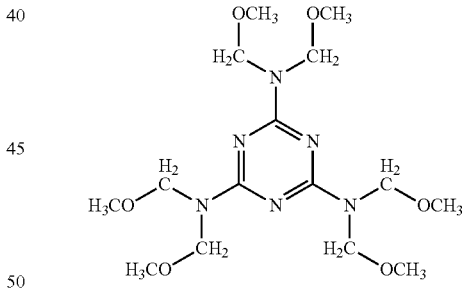

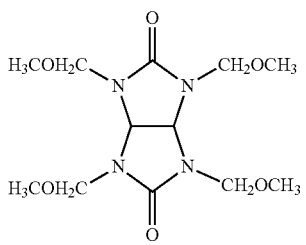

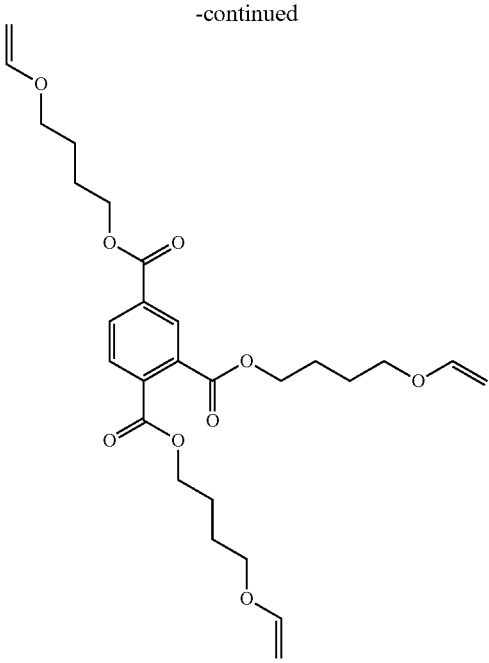

These crosslinking agents are available, for example, from Sanwa Chemical Co., Ltd., Honshu Chemical Industry Co., Ltd., Asahi Yukizai Corporation, and Nippon Carbide Industries Co., Inc.

In one embodiment of the present invention, the amount of the crosslinking agent is preferably 0-300,000 ppm comparing to mass of total composition. If the composition comprises a cross linking agent, the amount is preferably 0.1-100,000 ppm, more preferably 1-50,000 ppm, further preferably 10-10,000 ppm.

Also without adding an effective dose of a crosslinking agent, this composition according to the invention can exhibit its effect. In this case, the crosslinking agent amount comparing to mass of total composition is preferably 0-20,000 ppm, more preferably 0-5,000 ppm, further preferably 0-1,000 ppm, and further more preferably 0-100 ppm.

In an embodiment of the present invention, the amount of the crosslinking agent is preferably 1-200% (more preferably 5-100%, further preferably 10-40%, and further more preferably 15-25%) by mass relative to the mass of the ethynyl derived composite (or the total mass of the two or more ethynyl derived composites) comprised in the composition. The incorporation of the crosslinking agent in the composition is expected to produce the following effect: the crosslinking agent binds to the ethynyl derived composite during coating formation to control the intramolecular torsion of the whole composite of the crosslinking agent and the compound and increase the planarity of the composite.

Given the ease of process control, the present invention may be implemented as an embodiment in which the ethynyl derived composite is formed into a coating by itself without addition of the crosslinking agent (this means that the amount of the crosslinking agent is 0% by mass relative to the mass of the ethynyl derived composite).

Acid Generator

One embodiment of a composition according to the present invention may further comprise an acid generator. The amount of the acid generator contained in the composition is preferably 0.1-10% by mass, more preferably 1-7% by mass, and further preferably 1-5% by mass relative to the mass of the ethynyl derived composite according to the invention (or the total mass of the two or more ethynyl derived composites).

The acid generator can be a thermal acid generator capable of generating a strong acid when heated. The thermal acid generator (TAG) used in an embodiment of the present invention can comprise one or more thermal acid generators which, when heated, generate an acid capable of reacting with the ethynyl derived composite and capable of promoting crosslinking of the ethynyl derived composite. The acid is more preferably a strong acid such as sulfonic acid. The thermal acid generator is preferably activated at a temperature above 80 degrees. Examples of the thermal acid generator include: metal-free sulfonium salts such as triarylsulfonium, dialkylarylsulfonium, and diarylalkylsulfonium salts of strong non-nucleophilic acids; metal-free iodonium salts such as alkylaryliodonium and diaryliodonium salts of strong non-nucleophilic acids; and ammonium, alkylammonium, dialkylammonium, trialkylammonium, and tetraalkylammonium salts of strong non-nucleophilic acids. Covalent thermal acid generators are also considered useful as additives, and examples include 2-nitrobenzyl esters of alkylsulfonic or arylsulfonic acids and other sulfonic acid esters which are thermally decomposed to give free sulfonic acid. Examples thereof include diaryliodonium perfluoroalkyl, and sulfonates. Examples of labile esters include: nitrobenzyl tosylates such as 2-nitrobenzyl tosylate, 2,4-dinitrobenzyl tosylate, 2,6-dinitrobenzyl tosylate, and 4-nitrobenzyl tosylate; benzenesulfonates such as 2-trifluoromethyl-6-nitrobenzyl 4-chlorobenzenesulfonate and 2-trifluoromethyl-6-nitrobenzyl 4-nitrobenzenesulfonate; phenolic sulfonate esters such as phenyl 4-methoxybenzenesulfonate; quaternary ammonium tris(fluoroalkylsulfonyl)methides; quaternary alkylammonium bis(fluoroalkylsulfonyl)imides; and alkylammonium salts of organic acids such as triethylammonium salt of 10-camphorsulfonic acid. A variety of amine salts of aromatic (anthracene, naphthalene, or benzene derivative) sulfonic acids, including those disclosed in U.S. Pat. Nos. 3,474,054B, 4,200,729B, 4,251,665B, and 5,187,019B, can be used as the TAG.

The following are exemplified embodiments of the thermal acid generator that can be contained in the composition. The scope of the present invention is not limited to them.

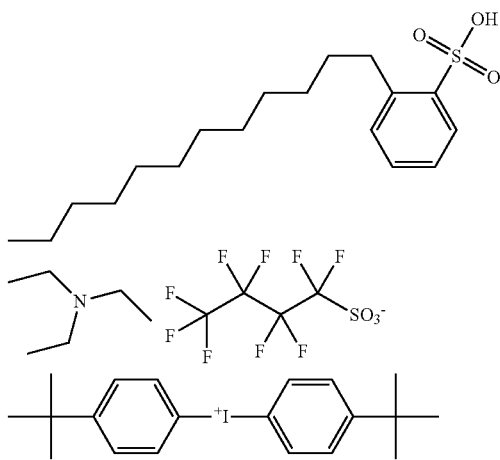

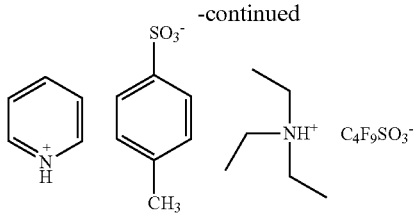

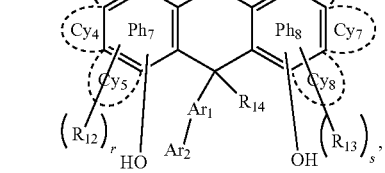

formula (7)

Given the ease of process control, the present invention may be implemented as an embodiment in which the acid generator is not added to the composition (this means that the amount of the acid generator is 0% by mass relative to the mass of the ethynyl derived composite).

In one embodiment of the present invention, the amount of the acid generator is preferably 0-50,000 ppm, more preferably 0-5,000 ppm, further preferably 0-1,000 ppm, further more preferably 0-100 ppm comparing to mass of total composition.

Radical Generator

A radical generator can be added to the composition to initiate polymerization. The radical generator generates radicals when heated, and examples thereof include azo compounds and peroxides. Exemplified embodiments of the radical generator include: organic peroxides, including hydroperoxides such as diisopropylbenzene hydroperoxide, cumene hydroperoxide, and t-butyl hydroperoxide, dialkyl peroxides such as α,α-bis(t-butylperoxy-m-isopropyl)benzene, dicumyl peroxide, 2,5-dimethyl-2,5-bis(t-butylperoxy)hexane, t-butyl cumyl peroxide, di-t-butyl peroxide, 2,5-dimethyl-2,5-bis(t-butylperoxy)hexyne-3, and t-butyl peroxy-2-ethylhexanoate, ketone peroxides, peroxyketals such as n-butyl 4,4-di(t-butylperoxy)valerate, diacyl peroxides, peroxydicarbonates, and peroxyesters; and azo compounds such as 2,2'-azobisisobutyronitrile, 1,1'-(cyclohexane-1-1-carbonitrile), 2,2'-azobis(2-cyclopropylpropionitrile), and 2,2'-azobis(2,4-dimethylvaleronitrile). These thermal radical generators may be used alone or in combination with one another and are preferably used alone. These known radical generators can be used in the composition, and these radical generators are available, for example, from NOF CORPORATION.

Given the ease of process control, the present invention may be implemented as an embodiment in which the radical generator is not added to the composition (this means that the amount of the radical generator is 0% by mass relative to the mass of the ethynyl derived composite).

As one embodiment, the amount of the radical generator in a composition of the present invention is preferably 0-50,000 ppm, more preferably 0-5,000 ppm, further preferably 0-1,000 ppm, further more preferably 0-100 ppm comparing to mass of total composition.

High-Carbon Material

The composition according to the invention may comprise a high-carbon material, and the high-carbon material is an organic substance with large carbon number in it. With adding a high-carbon material in the composition, atoms numbers of solid components in the composition can be controlled to satisfy above described formula (3), (3)' and/or (3)".

One embodiment of a high-carbon material is represented by below formula (7).

An is a direct bond, $C_{1-6}$ alkyl, $C_{6-12}$ cycloalkyl, or $C_{6-14}$ aryl. $Ar_1$ is preferably a direct bond, $C_{1-6}$ alkyl, or phenyl, more preferably a direct bond, linear $C_3$ alkyl, linear $C_6$ alkyl, tertiary butyl, or phenyl, and further preferably a direct bond or phenyl.

$Ar_2$ is $C_{1-6}$ alkyl, $C_{6-12}$ cycloalkyl, or $C_{6-14}$ aryl. $Ar_2$ is preferably isopropyl, tertiary butyl, $C_6$ cycloalkyl, phenyl, naphthyl, phenanthryl, or biphenyl, and more preferably phenyl.

$R_{12}$ and $R_{13}$ are each independently $C_{1-6}$ alkyl, hydroxy, halogen, or cyano. $R_{12}$ and $R_{13}$ are preferably each independently methyl, ethyl, propyl, isopropyl, tertiary butyl, hydroxy, fluorine, chlorine, or cyano, and more preferably each independently methyl, hydroxy, fluorine, or chlorine.

$R_{14}$ is hydrogen, $C_{1-6}$ alkyl, or $C_{6-14}$ aryl. $R_{14}$ is preferably hydrogen, $C_{1-6}$ alkyl, or phenyl, more preferably hydrogen, methyl, ethyl, linear $C_5$ alkyl, tertiary butyl, or phenyl, further preferably hydrogen or phenyl, and further more preferably hydrogen.

When $Ar_2$ is $C_{1-6}$ alkyl or $C_{6-14}$ aryl and $R_7$ is $C_{1-6}$ alkyl or $C_{6-14}$ aryl, $Ar_2$ and $R_{14}$ are optionally linked to each other to form a hydrocarbon ring.

r and s are each independently 0, 1, 2, 3, 4, or 5. r and s are preferably each independently 0 or 1, and r and s are more preferably each independently 0.

At least one of the $Cy_3$, $Cy_4$, and $Cy_5$ rings each surrounded by the broken line is an aromatic hydrocarbon ring fused with the adjacent aromatic hydrocarbon ring $Ph_7$, and the total number of carbon atoms of the aromatic hydrocarbon ring and the aromatic hydrocarbon ring $Ph_r$ is preferably $C_{10-14}$ and more preferably $C_{10}$.

At least one of the $Cy_6$, $Cy_7$, and $Cy_8$ rings each surrounded by the broken line is an aromatic hydrocarbon ring fused with the adjacent aromatic hydrocarbon ring $Ph_8$, and the total number of carbon atoms of the aromatic hydrocarbon ring and the aromatic hydrocarbon ring $Ph_8$ is preferably $C_{10-14}$ and more preferably $C_{10}$.

In formula (7), the bonding positions of $R_{12}$, $R_{13}$, and OH are not limited.

For example, the compound shown below can have the following structure of formula (7). That is, the aromatic hydrocarbon ring $Ph_7$ and the aromatic hydrocarbon ring $Cy_5$ are fused with each other to form a naphthyl ring, and OH is bonded to the aromatic hydrocarbon ring $Cy_5$. An is a direct bond, $Ar_2$ and $R_{14}$ are each phenyl, and $A_2$ and $R_{14}$ are linked to each other to form a hydrocarbon ring (fluorene).

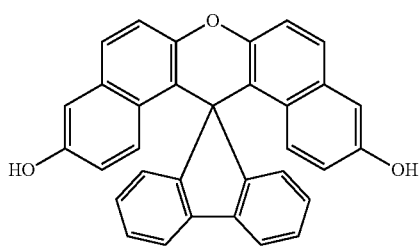 [SMILES: Oc1ccc2c3c(ccc2c1)Oc1ccc2cc(O)ccc2c1C31c2ccccc2-c2ccccc21]

Exemplified compounds of the high-carbon material represented by formula (7) are shown below for illustrative purpose. These examples are not intended to limit the present invention.

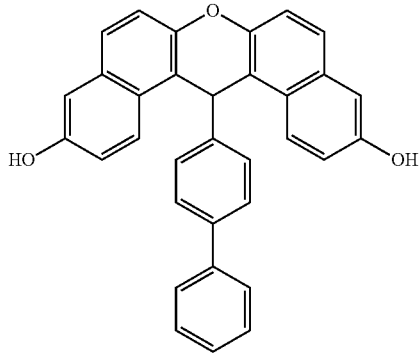

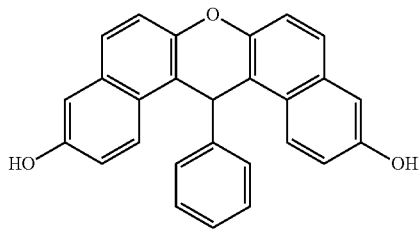

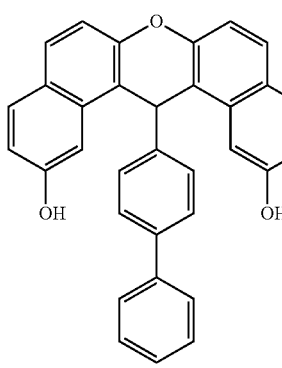

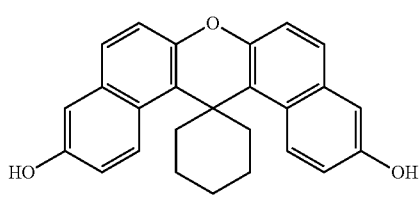

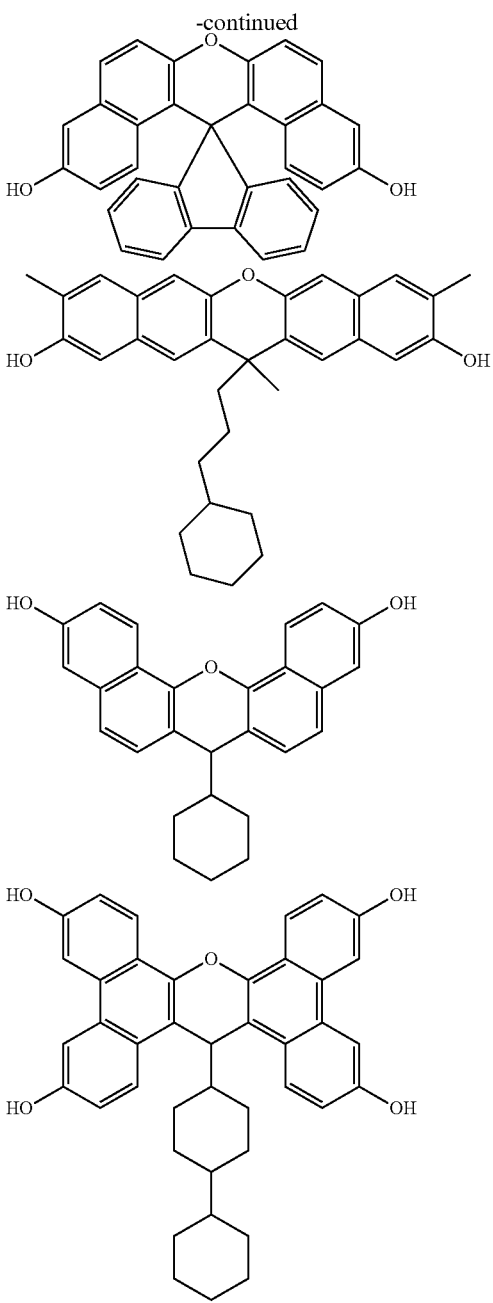

Other Components

To the composition according to the invention, there may be further added other components such as a photopolymerization initiator, an agent for enhancing the adhesion to substrates, a lubricating agent, a monomeric dye, a lower alcohol ($C_{1-6}$ alcohol), a surface leveling agent, an antifoaming agent, and a preservative agent. The amount of these components in the composition is preferably 0.1-10% by mass and more preferably 0.5-5% by mass relative to the amount of the ethynyl derived composite in the composition. In an aspect of the present invention, the composition contains none (0% by mass) of these components.

As one embodiment of the present invention, the amount of the other component (preferably photopolymerization initiator) is preferably 0-100,000 ppm, more preferably 0-5,000 ppm, further preferably 0-1,000 ppm, further more preferably 0-100 ppm comparing to mass of total composition.

Resist Underlayer Forming Composition

The composition according to the invention is advantageous as a resist underlayer-forming composition used, for example, for producing a pattern by a lithography technique. The lithography technique employs various coatings (which may also be referred to as "layers") with different purposes to form a fine pattern. The composition is advantageously used to form such a coating due to its good coating formation property, gap filling property and heat resistance.

The resist underlayer is a coating formed between a substrate and a photoresist layer. It is not necessary to locate resist underlayer contact with photoresist layer. Examples of the resist underlayer include a planarizing coating, an adhesive layer, Spin on carbon coating (SOC layer) and a bottom anti-reflective coating (BARC layer). The resist underlayer alone may have the functions of these layers or coatings; for example, the resist underlayer may function both as a planarizing coating and as a BARC layer. The resist underlayer-forming composition is a composition for forming an resist underlayer. A preferred embodiment of the resist underlayer is a planarizing coating, and a preferred embodiment of the resist underlayer-forming composition is a planarizing coating-forming composition.

The planarizing coating-forming composition according to the present invention is a composition that can be formed into a coating placed between a substrate and a photoresist coating and having an upper surface (the surface facing the photoresist) having high flatness. Preferably, an interlayer (such as a Si-containing resist interlayer, an adhesive layer, a bottom anti-reflective coating, or any combination of any of these) may be formed on the upper surface of the planarizing coating (the surface facing the photoresist), and the photoresist layer may be formed on the interlayer. The substrate present invention may be a flat substrate, in view of high etching resistance of the composition and the ease of handling. Even when the substrate is a not-flat substrate, a composition of the present invention exhibits its effect sufficiently by virtue of having good gap filling property.

The planarizing coating of the invention can also be effectively used as a hard mask layer, since the ethynyl derived composite has high heat resistance, high etching resistance, and advantageous filling property. Hard mask layers are formed to a large thickness (1,000-3,000 nm, for example); thus, the fact that a heat-induced decrease in thickness is small is advantageous in preventing distortion of the coatings. Additionally, hard mask layers are required to have higher etching resistance than common planarizing coatings and spin-on-carbon coatings (SOC coatings). A preferred embodiment of the planarizing coating-forming composition is a hard mask layer-forming composition.

Method for Manufacturing Coating

One aspect of the method for manufacturing a coating according to the present invention will be described.

As previously stated, it is one preferred embodiment that the resist underlayer according to the invention is a planarizing coating. A "planarizing coating-forming composition" as defined in the present invention refers to a composition that can be formed into a coating placed between a substrate and a photoresist coating and having an upper surface (the surface facing the photoresist) having high flatness. Having high flatness means that the upper surface of the planarizing coating formed is horizontal. When the planarizing coating has high flatness, the variation in distance between the horizontally positioned bottom surface of a substrate (or the lowest substrate of a plurality of stacked substrates) and the upper surface of the coating is small. A "flat substrate" refers to a substrate in which the distance between the bottom surface and top surface is substantially constant (the variation in the distance is from 0-3% in the substrate). A "not-flat substrate" broadly refers to a substrate that is not a flat substrate.

Hereinafter, the present invention will be described with reference to the drawings for ease of understanding. To obtain a composition capable of being suitably formed into a coating on a substrate having a dense region and sparse region, the present inventors examined Examples and Comparative Examples using a substrate shown in FIGS. 1 and 2. An inexact reduction scale is used in FIGS. 1 and 2 for ease of understanding of the invention. Reference numeral 1 denotes an island region, which extends over 100 μm or more. Reference numeral 2 denotes a sea region, which has 100 μm width. Reference numeral 3 denotes a dense region, which extends over 100 μm or more and in which wall structures with a depth of 100 nm are arranged in parallel, with a half pitch of 0.04 μm and a line-to-space ratio of 1:2.5. The substrate is a $SiO_2$ wafer having a sufficient width. Reference numeral 4 denotes the bottom surface of the substrate, and reference numeral 5 denotes the lower part of the substrate. When the substrate has a plurality of sea regions or gaps, a height or distance as described in the present invention is determined on the basis of one of the sea regions or gaps that is nearest the bottom surface (with the exception of a hole piercing through the substrate and a structure deviating from the intended design). Reference numeral 6 denotes the top part of the substrate. When the substrate has a plurality of top parts or gaps, a height or distance as described in the present invention is determined on the basis of one of the top parts that is farthest from the bottom surface (with the exception of a structure deviating from the intended design). Reference numeral 7 denotes a height between the island region and the sea region and corresponds to the difference between the distance from the top part of the island region to the bottom surface and the distance from the lower part contiguous with the island region to the bottom surface. Reference numeral 8 denotes a height between the dense region and the sea region and corresponds to the difference between the distance from the top part of the dense region to the bottom surface and the distance from the lower part contiguous with the dense region to the bottom surface. A coating is formed as shown by reference numeral 9 in FIG. 2; it is difficult for the coating to be completely flat (being "completely flat" means that the distance from the coating to the bottom surface is constant). Reference numeral 10 denotes the height from the bottom surface of the substrate to the upper surface of the underlayer formed on the island region, while reference numeral 11 denotes the height from the bottom surface of the substrate to the upper surface of the underlayer formed on the dense region. The composition according to the invention is advantageous because it can be formed into a coating on a not-flat substrate so that the difference between the heights denoted by reference numeral 10 and reference numeral 11 becomes small (so that high flatness is achieved). In evaluation of this composition, the difference between the heights is referred to as a "planarization index".

Examples of the not-flat substrate present invention include a silicon-containing substrate with a difference in height between the top part and the lower part (namely a difference between the distance from the top part to the bottom surface and the distance from the lower part to the bottom surface) of 20-10,000 nm. The difference in height is preferably 50-1,000 nm and more preferably 50-500 nm. It is preferable to determine the difference in height in a structure where the top part and the lower part adjoin to each other as shown by reference numerals 7 and 8. Other examples of the not-flat substrate include a substrate having a wall or contact hole resulting from pre-treatment and further include a substrate in which the difference between the distance from the top part to the bottom surface and the distance from the lower part to the bottom surface is 30-95% (preferably 30-80%) of the values mentioned above. The wall or contact hole can be formed by a known technique such as lithography, etching, or DSA, and preferably has an aspect ratio of 3-25 (preferably 5-10). A substrate in which wall structures are merely arranged at intervals (see the region denoted by reference numeral 3 in FIG. 1) is also a not-flat substrate. The advantage of the composition according to the invention becomes evident, for example, when the substrate has both a region where such structures are densely arranged (dense region) and a region where such structures are absent (sparse region). Furthermore, the composition is applicable to a substrate with a step (see the regions denoted by reference numeral 1 and reference numeral 2 in FIG. 1). The height of the step is preferably 20-10,000 nm, more preferably 50-1,000 nm, and even more preferably 50-500 nm.

When the coating of the present invention is applied to a flat substrate (bare wafer) and formed into an underlayer by heating, the underlayer can have a thickness of 20-2,000 nm (preferably 100-500 nm, more preferably 200-400 nm).

As described above, the substrate used can be a flat substrate or a not-flat substrate. The advantage of the present invention becomes more evident when a not-flat substrate is used.

The substrate used can be a metal-containing substrate or a silicon-containing substrate. The substrate present invention may be a single-layer substrate or a multi-layer substrate composed of a plurality of substrate layers. As the substrate there can be used any known substrate such as a silicon-coated substrate, silicon dioxide-coated substrate, silicon nitride-coated substrate, silicon wafer substrate (such as a $SiO_2$ wafer), glass substrate, indium-containing substrate (such as an ITO substrate), or titanium-containing substrate (such as a titanium nitride or titanium oxide substrate).

In the process for manufacturing a semiconductor according to the present invention, any known manner can be employed for the configuration of the substrate according to the conditions of the process. Examples of the configuration of the substrate include the multi-layer configurations listed below. The left-to-right direction in the following list corresponds to the bottom-to-top direction in the multi-layer configurations.

Silicon wafer substrate

Silicon wafer substrate/titanium-containing substrate

Silicon wafer substrate/titanium-containing substrate/silicon-coated substrate

Silicon wafer substrate/titanium-containing substrate/silicon dioxide-coated substrate Silicon wafer substrate/silicon dioxide-coated substrate/titanium-containing substrate Silicon nitride substrate Silicon nitride substrate/titanium-containing substrate Silicon nitride substrate/titanium-containing substrate/silicon-coated substrate Silicon nitride substrate/titanium-containing substrate/silicon dioxide-coated substrate Silicon nitride substrate/silicon dioxide-coated substrate/titanium-containing substrate One substrate to be laminated on another substrate can be formed by a known technique such as CVD. The one substrate can be patterned by a known lithography technique or etching technique. Still another substrate can be laminated on the patterned substrate by a known technique such as CVD.

As one embodiment, a composition of the present invention is applied by an appropriate application means such as a spinner or coater. In the application of the composition to the substrate, it is preferable for the substrate and the composition according to the invention to come into direct contact with each other, but the composition may be applied with another thin coating (such as a substrate-modifying layer) interposed between the composition and the substrate. The application of the composition is followed by ultraviolet irradiation and/or heating to form an underlayer. Preferably, the composition is cured by heating.

As for the conditions of the ultraviolet irradiation of the applied composition, it is preferable to irradiate the composition with ultraviolet radiation having a wavelength of 10-380 nm at a total radiation dose of 100-10,000 $mJ/cm^2$. The wavelength is preferably 10-200 nm, more preferably 100-200 nm, even more preferably 125-195 nm, and still even more preferably 170-175 nm. The total radiation dose is preferably 100-5,000 $mJ/cm^2$, more preferably 200-1,000 $mJ/cm^2$, and even more preferably 300-800 $mJ/cm^2$. The above conditions can be appropriately modified depending on the thickness of the coating to be formed.

As for the heating conditions employed when the underlayer is cured by heating, the heating temperature is typically selected from the range of 200-600° C. (preferably 200-500° C., more preferably 220-450° C., further preferably 220-450, further more preferably 250-400° C.), and the heating time is typically selected from the range of 30-180 seconds (preferably 30-120 seconds). The heating can be carried out in separate steps (step bake).

For example, the heating may be three-step heating consisting of: first heating by which the substrate is gap-filled along with removal of the solvent; and second heating by which the composition is mildly reflowed and thus formed into a coating with high flatness. For example, it is preferable that the first heating be performed at 200-300° C. for 30-120 seconds, the second heating be performed at 300-400° C. for 30-120 seconds, and the third heating be performed at 300-500° C. for 30-120 seconds.

The ultraviolet irradiation or heating may be performed in an air atmosphere, whose oxygen concentration can be reduced to prevent oxidation of the underlayer-forming composition and underlayer. For example, the oxygen concentration may be adjusted to 1,000 ppm or less (preferably 100 ppm or less) by introducing an inert gas ($N_2$, Ar, He, or a mixture thereof) into the atmosphere.

Formation of Photoresist Coating and Other Coatings

A photoresist composition (such as a positive-type photoresist composition) is applied to the underlayer formed as described above. The positive-type photoresist composition as described herein refers to a photoresist composition that undergoes a reaction under light irradiation and whose light-irradiated portion has an increased solubility in a developer. The photoresist composition used is not particularly limited, and any positive-type photoresist composition, negative-type photoresist composition, or negative tone development (NTD) photoresist composition can be used, as long as the photoresist composition is sensitive to the exposure light for pattern formation.

In the method for manufacturing a resist pattern, a coating or layer other than the underlayer formed from the underlayer-forming composition and the photoresist coating may be present. An interlayer may be interposed between the underlayer and the photoresist coating so that the underlayer and the photoresist coating are not in direct contact with each other. The interlayer is a coating formed between the photoresist coating and the underlayer, and examples of the interlayer include a bottom anti-reflecting coating (BARC layer), an inorganic hard mask interlayer (such as a silicon oxide coating, silicon nitride coating, or silicon oxynitride coating), and an adhesive coating. The interlayer may consist of a single layer or a plurality of layers. A top anti-reflective coating (TARC layer) may be formed on the photoresist coating.

In the process for manufacturing a device, any known manner can be employed for the configuration of the layers other than the coating according to the conditions of the process. Examples of the configuration that can be employed when the underlayer is a planarizing coating include the following multi-layer configurations.

Substrate/planarizing coating/photoresist coating

Substrate/planarizing coating/BARC layer/photoresist coating

Substrate/planarizing coating/BARC layer/photoresist coating/TARC layer

Substrate/planarizing coating/inorganic hard mask interlayer/photoresist coating/TARC layer Substrate/planarizing coating/inorganic hard mask interlayer/BARC layer/photoresist coating/TARC layer Substrate/planarizing coating/adhesive coating/BARC layer/photoresist coating/TARC layer Substrate/substrate-modifying layer/planarizing coating/BARC layer/photoresist coating/TARC layer Substrate/substrate-modifying layer/planarizing coating/adhesive coating/BARC layer/photoresist coating/TARC layer These layers can be cured by heating and/or exposure after being applied or can be formed by a known technique such as CVD. These layers can be removed by a known technique (such as etching) and can each be patterned through an upper layer as a mask.

In an aspect of the present invention, the coating according to the invention can be formed on a not-flat substrate, and another substrate can be formed on the coating. The other substrate can be formed, for example, by a technique such as CVD. The lower substrate and the upper substrate may have the same composition or different compositions. Still another layer can further be formed on the upper substrate.

Patterning and Device Manufacturing

The photoresist coating is exposed through a given mask. The wavelength of the light used for exposure is not particularly limited. The exposure is preferably performed with light having a wavelength of 13.5-248 nm. In particular, KrF excimer laser (wavelength: 248 nm), ArF excimer laser (wavelength: 193 nm), or extreme ultraviolet light (wavelength: 13.5 nm) can be used, and KrF excimer laser is more preferred. These wavelengths may vary within ±1%. The exposure can, if desired, be followed by post-exposure bake. The temperature for the post-exposure bake is selected from the range of 80-150° C., preferably 100-140° C., and the heating time for the post-exposure bake is selected from the range of 0.3-2 minutes, preferably 0.5-2 minutes.

Next, development is performed with a developer. When a positive-type photoresist composition is used, the exposed part of the positive-type photoresist layer is removed by the development, resulting in the formation of a photoresist pattern. This photoresist pattern can be made finer using, for example, a shrink material.

A 2.38 mass % (±1% concentration change accepted) aqueous TMAH solution is preferred as the developer used for the development in the above photoresist pattern formation method. The use of such a developer allows easy dissolution and removal of the planarizing coating at room temperature. An additive such as a surfactant can be added to the developer. The temperature of the developer is typically selected from the range of 5-50° C., preferably 25-40° C., and the development time is typically selected from the range of 10-300 seconds, preferably 30-60 seconds.

The interlayer, underlayer, and/or substrate can be patterned through the resulting photoresist pattern as a mask. For the pattern formation, a known technique such as etching (dry etching or wet etching) can be used. For example, the interlayer may be etched through the photoresist pattern as an etching mask, and then the planarizing coating and substrate may be etched through the resulting interlayer pattern as an etching mask to form a pattern on the substrate. Alternatively, the inorganic hard mask interlayer may be etched through the photoresist pattern as an etching mask, the planarizing coating may be etched through the resulting inorganic hard mask interlayer pattern as an etching mask, and then the substrate may be etched through the resulting planarizing coating pattern as an etching mask to form a pattern on the substrate. Alternatively, a layer below the photoresist layer (such as an interlayer and/or underlayer) may be etched through the photoresist pattern as an etching mask and, at the same time, the substrate may be etched through the photoresist pattern as an etching mask. Wiring can be formed in the substrate using the pattern formed on the substrate.

For example, the underlayer can be suitably removed by dry etching with $O_2$, $CF_4$, $CHF_3$, $Cl_2$, or $BCl_3$. $O_2$ or $CF_4$ can be suitably used.

Subsequently, the substrate, if necessary, is further processed to form an electric device. Such further processing can be done by using a known method. After formation of the device, the substrate, if necessary, is cut into chips, which are connected to a leadframe and packaged with a resin. Preferably the electric device is a semiconductor device, solar cell chip, organic light emitting device and inorganic light emitting device. More preferably the device is a semiconductor device.

EXAMPLES

Hereinafter, the present invention will be described with working examples. These examples are given only for illustrative purpose and not intended to limit the scope of the present invention. The term "part(s)" as used in the following description refers to part(s) by mass, unless otherwise stated.

Synthesis Example 1a of P1 Precursor

A reaction vessel equipped with a stirrer, a condenser (Liebig condenser), a heater, a nitrogen inlet tube, and a temperature controller was prepared. The reaction vessel was charged with 9-fluorenone (200 parts, Tokyo Chemical Industry Co., Ltd. herein later TCI), 9,9-Bis(4-hydroxyphenyl)fluorenone (2333 parts, Osaka Gas Chemicals Co., Ltd.) and dichloromethane (10430 parts), which were stirred in nitrogen atmosphere and were heated to 40° C. and kept that temperature. Then, Trifluoromethanesulfonic Acid (92 parts, Mitsubishi Materials Electronic Chemicals Co., Ltd.) and 3-Mercaptopropionate (6 parts, TCI) dissolved in dichloromethane (200 parts) were slowly added into the reaction vessel, and were stirred at 40° C. for 2 hours to allow the reaction. After completion of the reaction, the reaction solution was cooled to room temperature. Sufficient water was added to the reaction solution, and excessive 9,9-Bis (4-hydroxyphenyl)fluorenone was removed by filtration. The precipitate was washed by dichloromethane. Sufficient water was added to the dichloromethane solution to remove Trifluoromethanesulfonic Acid. Then, the resulting solution was distillated at 40° C., 10 mmHg to remove dichloromethane, and the P1 precursor (2111 parts) was obtained.

Mn and Mw were measured by GPC (tetrahydrofuran). Mn was 533 Da. Mw was 674 Da. Molecular weight distributions (Mw/Mn) was 1.26.

Synthesis Example 1b of P1

A reaction vessel equipped with a stirrer, a condenser (Liebig condenser), a heater, a nitrogen inlet tube, and a temperature controller was prepared. The reaction vessel was charged with P1 precursor (200 parts), potassium carbonate (323 parts) and acetone (616 parts), and kept 56° C. with stirring in the nitrogen atmosphere. Then, 3-bromo-1-propyne (278 parts) was added into the reaction vessel, and kept 56° C. with stirring for 3 hours to allow reaction. After the reaction completed, the reaction solution was cooled to normal room temperature. Excessive potassium carbonate and its salt were removed by filtration. The precipitate was washed with acetone. Then, the acetone solution was distillated at 40° C., 10 mmHg to remove acetone and to obtain a dry solid. The obtained dry solid was dissolved in ethyl acetate (820 parts). Sufficient water was added into the ethyl acetate solution to remove metal impurities. The ethyl acetate solution was distillated at 40° C., 10 mmHg to remove ethyl acetate to obtain a dry solid. The dried solid (185 parts) was dissolved in acetone (185 parts). Then, methanol (1850 parts) was added in the acetone solution, and filtered to obtain a solid. The solid was dried at 100° C., 10 mmHg. The resultant was P1 (76 parts).

Mn and Mw were measured by GPC (tetrahydrofuran). Mn was 789 Da. Mw was 1054 Da. Molecular weight distributions (Mw/Mn) was 1.34.

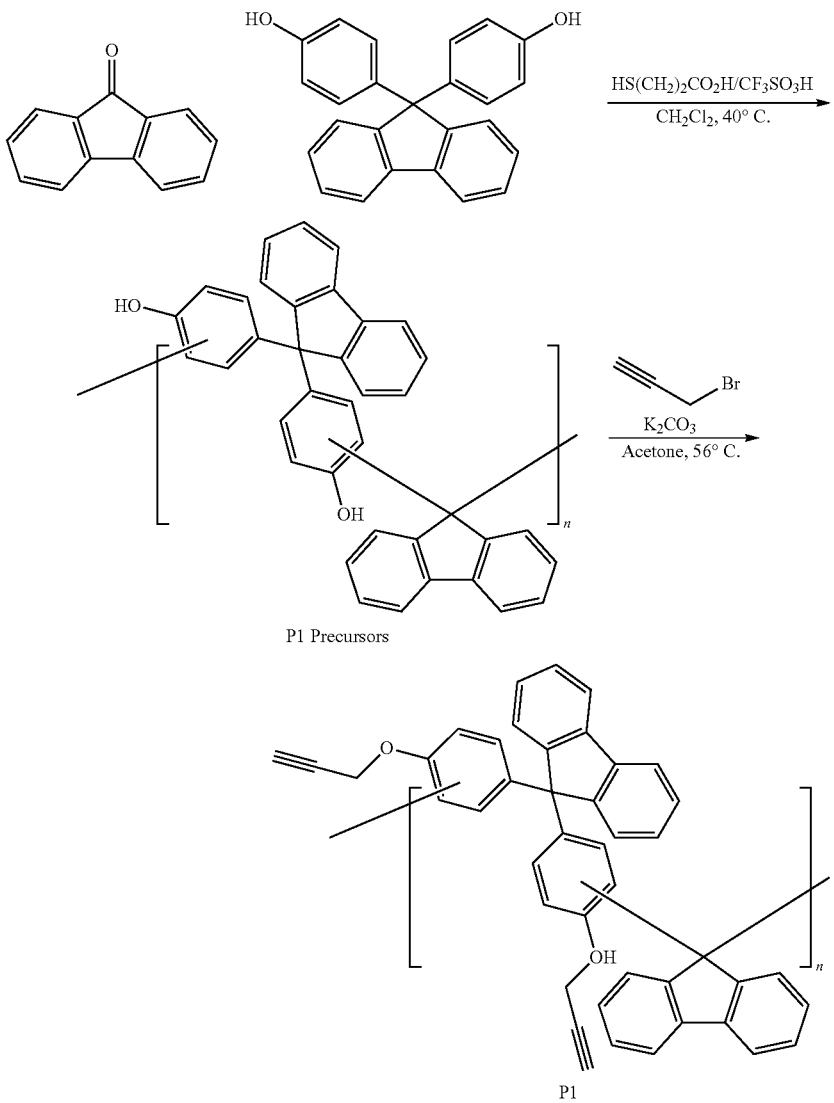

Synthesis Example 2 of P2

Synthesis was carried out in the same manner as in Synthesis Example 1, except for replacing 9,9-Bis(4-hydroxyphenyl)fluorenone with phenol (TCI). And P2 was obtained.

Mn and Mw were measured by GPC (tetrahydrofuran). Mn was 703 Da. Mw was 959 Da.

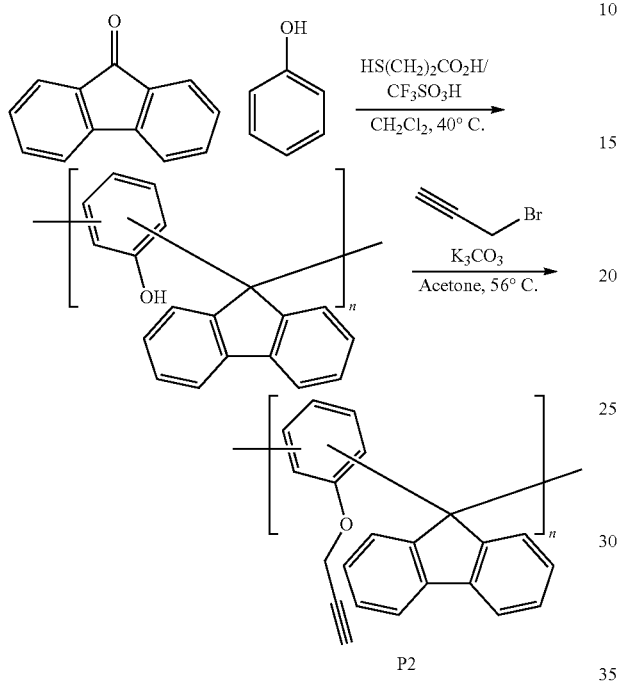

Synthesis Example 3 of P3

Synthesis was carried out in the same manner as in Synthesis Example 1, except for replacing 9,9-Bis(4-hydroxyphenyl)fluorenone with naphthol (TCI). And P3 was obtained.

Mn and Mw were measured by GPC (tetrahydrofuran). Mn was 810 Da. Mw was 1,120 Da.

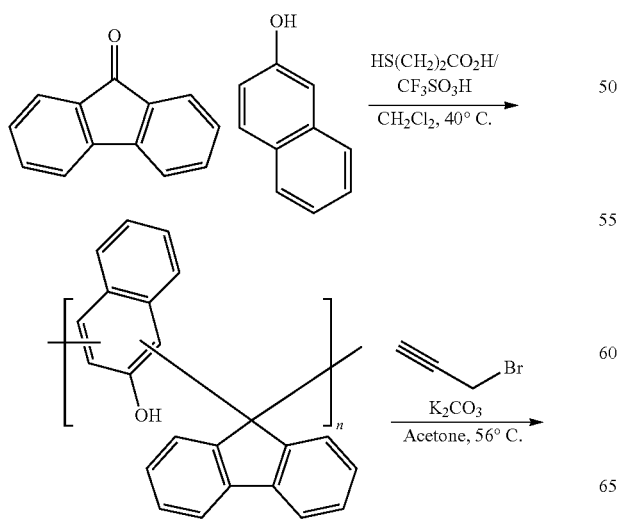

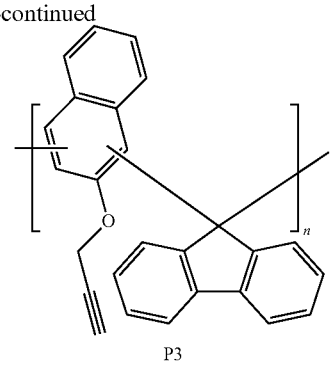

Synthesis Example 4 of P4

Synthesis was carried out in the same manner as in Synthesis Example 1, except for replacing 9-fluorenone with 2,3,6,7-dibenzo-9-fluorenone (Atomax chemicals Co., Ltd.) and replacing 9,9-Bis(4-hydroxyphenyl)fluorenone with phenol (TCI). And P4 was obtained.

Mn and Mw were measured by GPC (tetrahydrofuran). Mn was 845 Da. Mw was 1,190 Da.

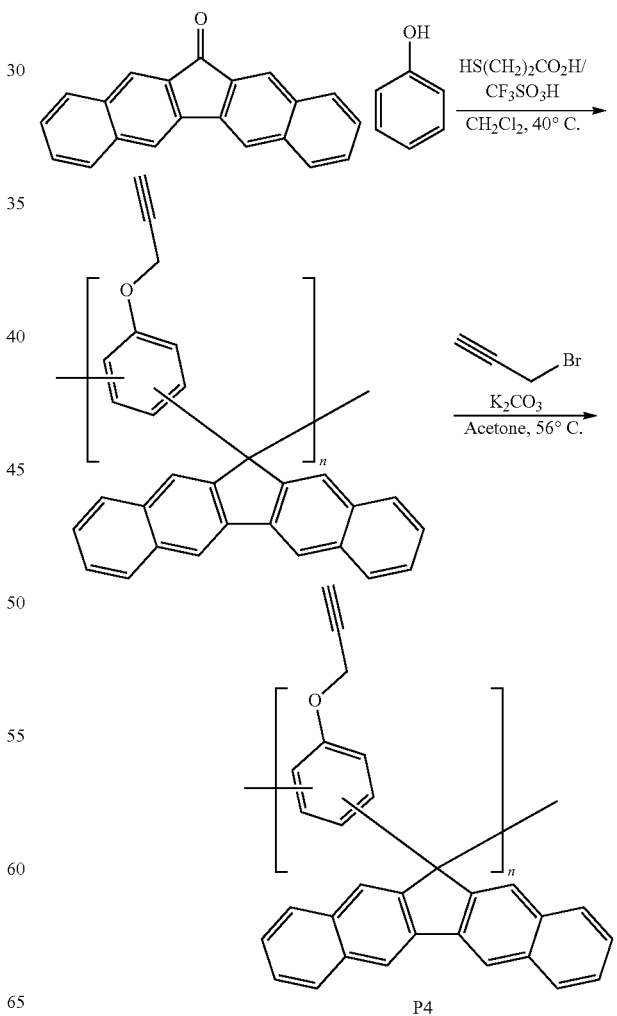

Synthesis Example 5 of P5

The synthesis was carried out in the same manner as in Synthesis Example 1, except for replacing 9-fluorenone with anthraquinone (TCI) and replacing 9,9-Bis(4-hydroxyphenyl)fluorenone with phenol (TCI). P5 was obtained.

Mn and Mw were measured by GPC (tetrahydrofuran). Mn was 720 Da. Mw was 1,250 Da.

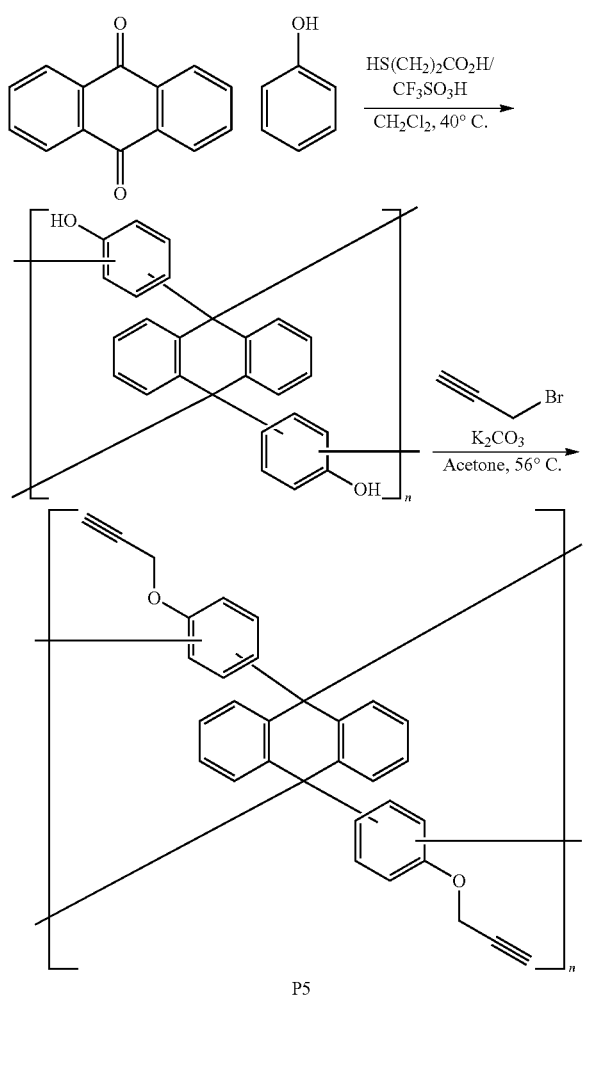

P5

Preparation Example 1 of Composition 1

P1 (100 parts) was added in Propylene Glycol 1-Monomethyl Ether 2-Acetate (PGMEA, 2,500 parts), and stirred. The solution was filtered with 0.2 μm filter (SLFG025NS, Merck Millipore). The filtered solution was obtained as composition 1.

Preparation Example 2-7 of Composition 2-7, Comparative Preparation Example 2-4 of Comparative Composition 2-4

Preparations were carried out in the same manners as in Preparation Example 1, except for replacing components and solvents as described in below Table 1. And, composition 2-7 and comparative composition 2-4 were obtained.

TABLE 1

| | Ethynyl derived composite (parts) | Cross linker (parts) | Solvent (parts) |
|---|---|---|---|
| Composition 1 | P1(100) | — | PGMEA(1700) |
| Composition 2 | P1(100) | TM-BIP-ANT(20) | PGMEA(2000) |
| Composition 3 | P1(100) | HM-HAP(20) | PGMEA(2000) |
| Composition 4 | P2(100) | — | PGMEA(2000) |
| Composition 5 | P3(100) | — | PGMEA(2000) |
| Composition 6 | P4(100) | — | PGMEA(2000) |
| Composition 7 | P5(100) | — | PGMEA(2000) |
| Comparative composition 1 | PA(100) | — | PGMEA(1700) |
| Comparative composition 2 | PB(100) | — | PGMEA(1700) |
| Comparative composition 3 | PC(100) | — | PGMEA(1700) |
| Comparative composition 4 | P1 Precursors(100) | — | PGMEA(1700) |

TM-BIP-ANT and HM-HAP were below.

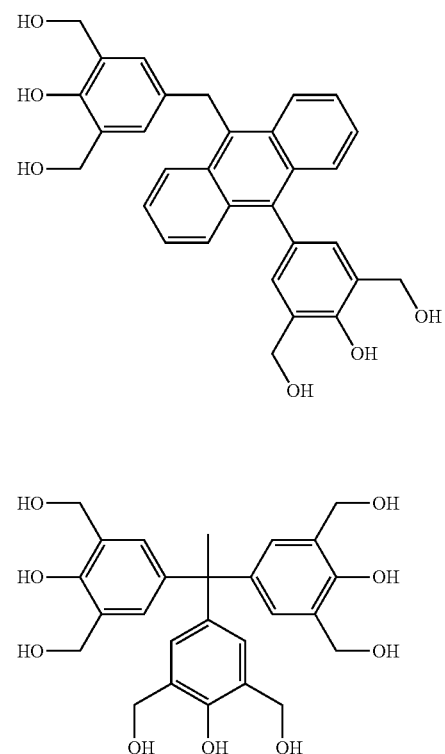

The compounds PA, PB, PC and PD, as used in the comparative examples, are defined below:

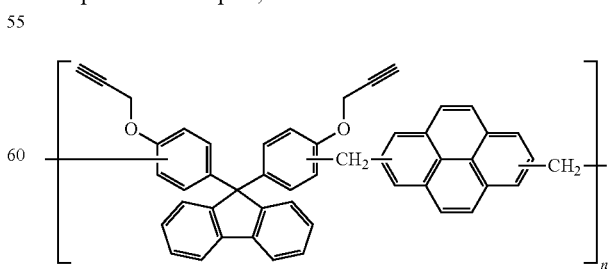

Described on JP2016167047A, Mw is about 3,500.

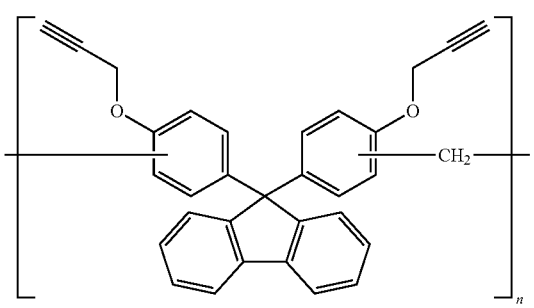

Described on JP2016167047A, Mw is about 4,500.

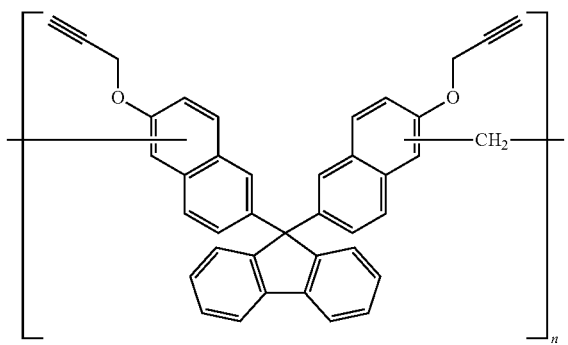

Described on JP2016167047A, Mw is about 4,500.

Evaluation of Weight Loss

Each composition was coated on a bare Si wafer (KST World Corp.) using CLEAN TRACK ACT 12 (Tokyo Electron Limited) at 1,500 rpm. The wafer was baked on a hot plate in an air atmosphere at 250° C. for 60 seconds and then at 350° C. for 60 seconds. A coating was thus formed from the composition. And the wafer was further baked on a hot plate in nitrogen atmosphere at 400° C. for 60 seconds. Then, the coating was scraped off. The obtained solid weight was measured as A (g). The obtained solid was baked until 400° C. by the rate of 20° C./min in air atmosphere using Thermo plus EVO2 (Rigaku Corp.). Then, the baked solid weight was measured as B (g).

Weight loss (%) was calculated as {100−(B/A)×100}. Data were shown in below Table 2.

TABLE 2

| | Weight loss (%) | Gap filling |
|---|---|---|
| Composition 1 | 2.4 | A |
| Composition 2 | 2.8 | A |
| Composition 3 | 2.6 | A |
| Composition 4 | 2.7 | A |
| Composition 5 | 2.4 | A |
| Composition 6 | 2.6 | A |
| Composition 7 | 2.4 | A |
| Comparative composition 1 | 3.1 | A |
| Comparative composition 2 | 4.2 | A |
| Comparative composition 3 | 2.4 | B |
| Comparative composition 4 | 3.5 | B |

Evaluation of Gap Filling

Each composition was coated on a stepped SiN wafer (Advanced Materials Technology, Inc.) having a trench with a width of about 10 nm and a height of 500 nm and having a top part with a width of 10 nm using a spin coater (MS-150A, Mikasa Co., Ltd.) at 1,500 rpm. The wafer was baked on a hot plate in an air atmosphere at 250° C. for 60 seconds and then at 350° C. for 60 seconds. The wafer was further baked in nitrogen atmosphere at 400° C. for 60 seconds to produce a coating from the composition. A section of the wafer with the coating was prepared, and its trench region was observed in by a SEM (S-5500, Hitachi High-Tech Fielding Corp.) photograph. The gap filling property of the composition was evaluated as follows. The evaluation results are shown in Table 2.

A: The composition successfully filled gaps so that gap with voids or pores was not found.

B: The composition failed to sufficiently fill gaps so that a gap with voids or pores was present.

Evaluation of Film Thickness Shrinkage

Each composition was coated on a Si bare wafer (KST World Corp.) using CLEAN TRACK ACT 12 (Tokyo Electron Limited) at 1,500 rpm. The wafer was baked on a hot plate in an air atmosphere at 250° C. for 60 seconds and then at 350° C. for 60 seconds. A coating was thus formed from the composition. The thickness of the coating on the wafer was measured with Lambda Ace VM-3110 Spectroscopic Reflectometer (SCREEN Holdings Co., Ltd), and this measured thickness is denoted by "Thickness A".

The wafer was further baked in nitrogen atmosphere at 400° C. for 60 seconds. The thickness of the coating on the wafer was measured with the Lambda Ace, and this measured thickness is denoted by "Thickness B".

Film thickness shrinkage (%) was calculated as {100−(B/A)×100}. Data were shown in below Table 3.

TABLE 3

| | Thickness A (nm) | Thickness B (nm) | Film thickness shrinkage (%) | Planarization index (nm) |
|---|---|---|---|---|
| Composition 1 | 116 | 112 | 3.4 | 2 |
| Composition 2 | 118 | 113 | 4.2 | 2 |
| Composition 3 | 117 | 113 | 3.4 | 4 |
| Composition 4 | 116 | 111 | 4.3 | 5 |
| Composition 5 | 118 | 114 | 3.4 | 3 |
| Composition 6 | 115 | 111 | 3.5 | 4 |
| Composition 7 | 114 | 110 | 3.5 | 6 |
| Comparative composition 1 | 118 | 111 | 5.9 | 22 |
| Comparative composition 2 | 116 | 108 | 6.9 | 21 |
| Comparative composition 3 | 119 | 115 | 3.4 | 30 |
| Comparative composition 4 | 117 | 112 | 4.3 | 32 |

Evaluation of Planarization Index

Each Composition was coated on a SiO$_2$ wafer (not-flat substrate) shown in FIG. 1 using a spin coater (MS-150A, Mikasa Co., Ltd.) at 1,500 rpm so that the composition filled the sea regions and the gaps between the walls in the dense regions and covered the island regions. The wafer was baked in air atmosphere at 250° C. for 60 seconds and further baked at 350° C. for 60 seconds. A coating was thus formed from the composition. The wafer was further baked at 400° C. for 60 seconds in nitrogen atmosphere. A section of the wafer with the coating was prepared, SEM (S-5500, Hitachi High-Tech Fielding Corp.) photograph was taken.

Figure 2:
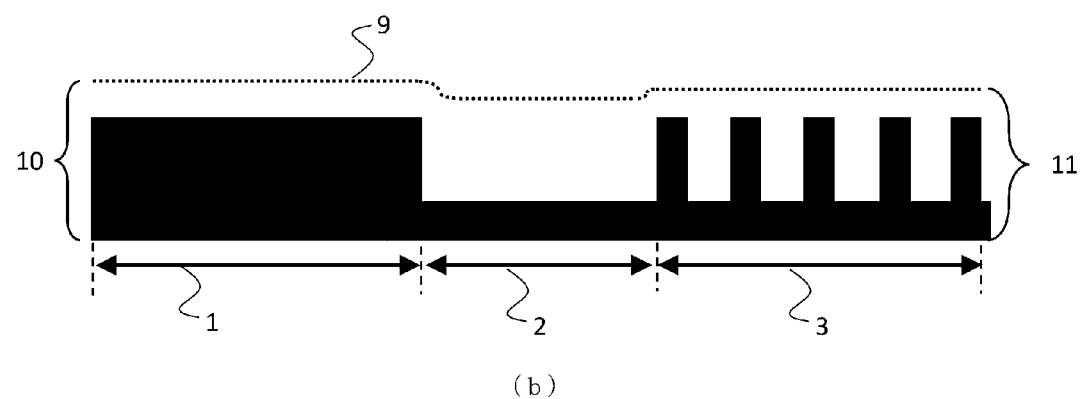
FIG. 2 is an explanatory drawing of a substrate structure and a coating on it used for planarization evaluation.

The Planarization index (the difference between the heights denoted by reference numeral 10 and reference numeral 11 in FIG. 2) was measured in the SEM photograph. Data were shown in Table 3.

REFERENCE SIGNS LIST

1. Island region of substrate
2. Sea region of substrate
3. Dense region of substrate
4. Bottom surface of substrate
5. Lower part of substrate
6. Top part of substrate
7. Height between island region and sea region
8. Height between dense region and sea region
9. Formed planarizing coating
10. Height between top part of island region and bottom surface of substrate
11. Height between top part of dense region and bottom surface of substrate

The invention claimed is:

1. A synthesis method of an ethynyl derived composite comprising;
Reacting components

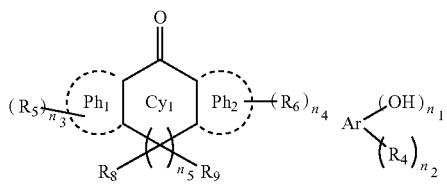

$Cy_1$ is a $C_{5-6}$ alicyclic compound;
$Ph_1$ and $Ph_2$ are each independently $C_{6-10}$ aromatic hydrocarbon rings, which individually compose adjacent 2 carbons in cyclic $Cy_1$;
$R_5$ and $R_6$ are each independently hydrogen, halogen, cyano, unsubstituted $C_{1-6}$ alkyl, or $C_{1-6}$ alkyl substituted with at least one substituent selected from halogen and cyano;
$R_8$ and $R_9$ are each independently hydrogen, unsubstituted $C_{1-6}$ alkyl, $C_{1-6}$ alkyl substituted with at least one substituent selected from halogen or cyano, unsubstituted $C_{6-16}$ aromatic hydro carbon, $C_{6-16}$ aromatic hydro carbon substituted with at least one substituent selected from halogen or cyano, unsubstituted $C_{1-6}$ alkylene linking to the other portion of the ethynyl derived composite, $C_{1-6}$ alkylene substituted with at least one substituent selected from halogen or cyano linking to the other portion of the ethynyl derived composite, or a direct bond bonding to the other portion of the ethynyl derived composite;
$n_3$ and $n_4$ are each independently 0, 1, 2, 3 or 4;
$n_5$ is 0 or 1;
Ar is each independently $C_{6-41}$ aromatic hydrocarbon ring;
$R_4$ is each independently $C_{1-6}$ alkyl, halogen or cyano;
$n_1$ is 1, 2, 3 or 4; and
$n_2$ is 0, 1, 2, 3 or 4;
and obtain a precursor, and
Replacing hydroxyl group with a group derived from ethynyl;
where the synthesized ethynyl derived composite is a polymer.

2. The synthesis method according to claim 1, where the ethynyl composite is described as below formula

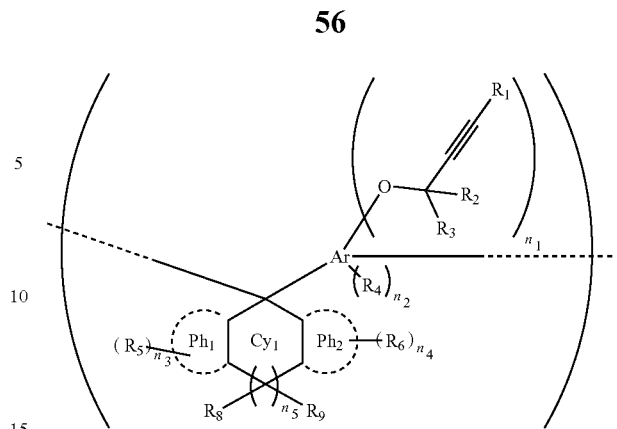

wherein
$Cy_1$ is a $C_{5-6}$ alicyclic compound;
$Ph_1$ and $Ph_2$ are each independently $C_{6-10}$ aromatic hydrocarbon rings, which individually compose adjacent 2 carbons in cyclic $Cy_1$;
$R_5$ and $R_6$ are each independently hydrogen, halogen, cyano, unsubstituted $C_{1-6}$ alkyl, or $C_{1-6}$ alkyl substituted with at least one substituent selected from halogen and cyano;
$R_8$ and $R_9$ are each independently hydrogen, unsubstituted $C_{1-6}$ alkyl, $C_{1-6}$ alkyl substituted with at least one substituent selected from halogen or cyano, unsubstituted $C_{6-16}$ aromatic hydro carbon, $C_{6-16}$ aromatic hydro carbon substituted with at least one substituent selected from halogen or cyano, unsubstituted $C_{1-6}$ alkylene linking to the other portion of the ethynyl derived composite, $C_{1-6}$ alkylene substituted with at least one substituent selected from halogen or cyano linking to the other portion of the ethynyl derived composite, or a direct bond bonding to the other portion of the ethynyl derived composite;
$n_3$ and $n_4$ are each independently 0, 1, 2, 3 or 4;
$n_5$ is 0 or 1;
Ar is each independently $C_{6-41}$ aromatic hydrocarbon ring;
$R_4$ is each independently $C_{1-6}$ alkyl, halogen or cyano;
$n_1$ is 1, 2, 3 or 4;
$n_2$ is 0, 1, 2, 3 or 4;
$R_1$ is each independently hydrogen, halogen, cyano, unsubstituted $C_{1-6}$ alkyl, $C_{1-6}$ alkyl substituted with at least one substituent selected from the group consisting of $C_{1-6}$ alkyl, halogen and cyano, unsubstituted $C_{3-20}$ aromatic ring, or $C_{3-20}$ aromatic ring substituted with at least one substituent selected from the group consisting of $C_{1-6}$ alkyl, halogen and cyano;
$R_2$ and $R_3$ are each independently hydrogen, halogen, cyano, unsubstituted $C_{1-6}$ alkyl, $C_{1-6}$ alkyl substituted with at least one substituent selected from the group consisting of $C_{1-6}$ alkyl, halogen and cyano, unsubstituted $C_{3-20}$ aromatic ring, or $C_{3-20}$ aromatic ring substituted with at least one substituent selected from the group consisting of $C_{1-6}$ alkyl, halogen and cyano; and
the broken straight line is a direct bond bonding to the other portion of the ethynyl derived composite.

3. The synthesis method according to claim 1; where the group derived from ethynyl to replace hydroxyl is represented by below formula;

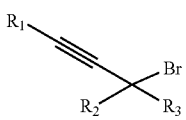

wherein $R_1$ is each independently hydrogen, halogen, cyano, unsubstituted $C_{1-6}$ alkyl, $C_{1-6}$ alkyl substituted with at least one substituent selected from the group consisting of $C_{1-6}$ alkyl, halogen and cyano, unsubstituted $C_{3-20}$ aromatic ring, or $C_{3-20}$ aromatic ring substituted with at least one substituent selected from the group consisting of $C_{1-6}$ alkyl, halogen and cyano;

$R_2$ and $R_3$ are each independently hydrogen, halogen, cyano, unsubstituted $C_{1-6}$ alkyl, $C_{1-6}$ alkyl substituted with at least one substituent selected from the group consisting of $C_{1-6}$ alkyl, halogen and cyano, unsubstituted $C_{3-20}$ aromatic ring, or $C_{3-2}u$ aromatic ring substituted with at least one substituent selected from the group consisting of $C_{1-6}$ alkyl, halogen and cyano.

4. The synthesis method according to claim 2; where
$Ph_1$ and $Ph_2$ are each independently phenyl or naphthyl;
$n_3$ and $n_4$ are 0;
$Ph_3$, $Ph_4$, $Ph_5$ and $Ph_6$ are each independently phenyl or naphthyl; or
$R_1$, $R_2$ and $R_3$ are hydrogen.

5. The synthesis method according to claim 1, where the main chain of the synthesized polymer has none or few secondary carbon and the tertiary carbon.

6. The synthesis method according to claim 1, wherein when synthesizing the polymer an aldehyde derivative is optionally used and the amount of the aldehyde derivative is 0-30 mol percent based on all the components to be used for the synthesis.

7. The synthesized method according to claim 1, where Mw of the synthesized polymer is 959 to 1,250 Da.

8. A method of manufacturing a composition, where the composition comprises a ethynyl derived composite according to claim 1 and solvent.

9. The method of manufacturing a composition according to claim 8,
wherein the solvent comprises at least one solvent selected from the group consisting of water, hydrocarbon solvent, ether solvent, ester solvent, alcohol solvent, and ketone solvent.

10. The method of manufacturing a composition according to claim 8,
wherein the solvent comprises at least one solvent selected from the group consisting of water, cyclohexanone, cyclopentanone, propylene glycol monomethyl ether, propylene glycol monoethyl ether, propylene glycol monopropyl ether, propylene glycol monobutyl ether, propylene glycol dimethyl ether, propylene glycol diethyl ether, propylene glycol 1-monomethyl ether 2-acetate, propylene glycol monoethyl ether acetate, propylene glycol monopropyl ether acetate, gamma-butyrolactone, ethyl lactate, or any mixture of any of these.

11. The method of manufacturing a composition according to claim 8, wherein the amount of the ethynyl derived composite is 2-60 mass percent relative to the total amount of the composition;
optionally the amount of the organic solvents is 60-98 mass percent relative to the total amount of the composition.

12. The method of manufacturing a composition according to claim 8, wherein a single or a plurality of solid components in the composition satisfy below Formula (3), 1.5≤{total number of atoms/(number of C−number of O)}≤3.5      Formula (3), the number of C is the number of carbon atoms, and
the number of O is the number of oxygen atoms.

13. The method of manufacturing a composition according to claim 8, wherein the composition comprises at least one additive selected from the group consisting of a surfactant, a crosslinking agent, an acid generator, a radical generator, a high-carbon material, a photopolymerization initiator, and an agent for enhancing adhesion to substrates;
optionally the composition comprises at least one selected from the group consisting of a crosslinking agent in a concentration of 0-300,000 ppm, a photopolymerization initiator in a concentration of 0-100,000 ppm, an acid generator in a concentration of 0-50,000 ppm, and a radical generator in a concentration of 0-50,000 ppm; or
optionally the amount of the surfactant is 0-5 mass percent relative to the total amount of the composition.

14. The method of manufacturing a composition according to claim 8, wherein the composition is a resist underlayer-forming composition.

15. A method for manufacturing a coating, comprising:
applying a layer of the composition manufactured according to claim 8 above a substrate; and curing the layer to form the coating;
optionally the substrate below the manufactured coating is a flat substrate or a non-flat substrate.

16. The method for manufacturing a coating according to claim 15, wherein the conditions for curing the composition comprise irradiation with ultraviolet radiations having a wavelength of 10-380 nm, or heating at 200-600 degrees centigrade for 30-180 seconds.

17. A method for manufacturing a device, comprising:
manufacturing a coating by the method according to claim 16,
forming a layer of a photoresist composition above the coating;
curing the photoresist composition to form a photoresist layer;
exposing the substrate coated with the photoresist layer;
developing the exposed substrate to form a resist pattern;
etching with the resist pattern as a mask; and
processing the substrate.

18. A method for manufacturing a device according to claim 17, further comprising forming wiring in the processed substrate.

19. A synthesis method of an ethynyl derived composite comprising;
Reacting the following components

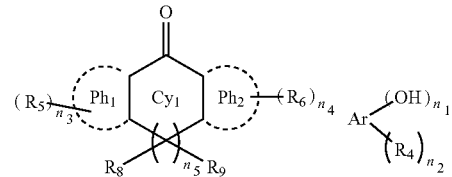

$Cy_1$ is a $C_{5-6}$ alicyclic compound;

$Ph_1$ and $Ph_2$ are each independently $C_{6-10}$ aromatic hydrocarbon rings, which individually compose adjacent 2 carbons in cyclic $Cy_1$;

$R_5$ and $R_6$ are each independently hydrogen, halogen, cyano, unsubstituted $C_{1-6}$ alkyl, or $C_{1-6}$ alkyl substituted with at least one substituent selected from halogen and cyano;

$R_8$ and $R_9$ are each independently hydrogen, unsubstituted $C_{1-6}$ alkyl, $C_{1-6}$ alkyl substituted with at least one substituent selected from halogen or cyano, unsubstituted $C_{6-16}$ aromatic hydro carbon, $C_{6-16}$ aromatic hydro carbon substituted with at least one substituent selected from halogen or cyano, unsubstituted $C_{1-6}$ alkylene linking to the other portion of the ethynyl derived composite, $C_{1-6}$ alkylene substituted with at least one substituent selected from halogen or cyano linking to the other portion of the ethynyl derived composite, or a direct bond bonding to the other portion of the ethynyl derived composite;

$n_3$ and $n_4$ are each independently 0, 1, 2, 3 or 4;

$n_5$ is 0 or 1;

Ar is each independently $C_{6-41}$ aromatic hydrocarbon ring;

$R_4$ is each independently $C_{1-6}$ alkyl, halogen or cyano;

$n_1$ is 1, 2, 3 or 4;

$n_2$ is 0, 1, 2, 3 or 4;

and obtain a precursor, and

Replacing hydroxyl group with a group derived from ethynyl;

where the synthesized ethynyl derived composite is a polymer of units A and units B, where mol ratio of unit A represented by formula (1) and unit B represented by formula (2) in the ethynyl derived composite is 60:40 to 40:60;

wherein the unit A is represented by below formula (1)

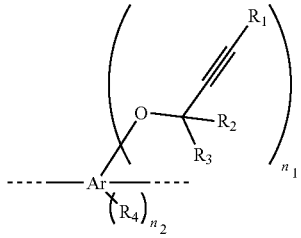

(1)

wherein Ar, $R_4$, $n_1$ and $n_2$ are each independently are defined above;

$R_1$ is each independently hydrogen, halogen, cyano, unsubstituted $C_{1-6}$ alkyl, $C_{1-6}$ alkyl substituted with at least one substituent selected from the group consisting of $C_{1-6}$ alkyl, halogen and cyano, unsubstituted $C_{3-20}$ aromatic ring, or $C_{3-20}$ aromatic ring substituted with at least one substituent selected from the group consisting of $C_{1-6}$ alkyl, halogen and cyano;

$R_2$ and $R_3$ are each independently hydrogen, halogen, cyano, unsubstituted $C_{1-6}$ alkyl, $C_{1-6}$ alkyl substituted with at least one substituent selected from the group consisting of $C_{1-6}$ alkyl, halogen and cyano, unsubstituted $C_{3-20}$ aromatic ring, or $C_{3-20}$ aromatic ring substituted with at least one substituent selected from the group consisting of $C_{1-6}$ alkyl, halogen and cyano;

the unit B is represented by below formula (2);

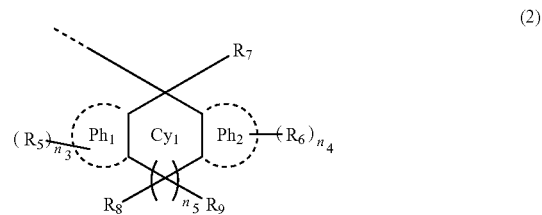

(2)

$Cy_1$, $Ph_1$, $Ph_2$, $R_5$, $R_6$, $R_8$, $R_9$, $n_3$, $n_4$ and $n_5$ are each independently defined above;

the broken straight line is a direct bond bonding to the other portion of the ethynyl derived composite;

$R_7$ is a direct bond bonding to the other portion of the ethynyl derived composite;

optionally unit A concentration compared to the whole units in one ethynyl derived composite according to the invention is 30-70 mol percent, and the unit B concentration compared to the whole units in one ethynyl derived composite according to the invention is 30-70 mol percent.

20. The synthesis method according to claim 19, where the unit A is represented by formula (1)';

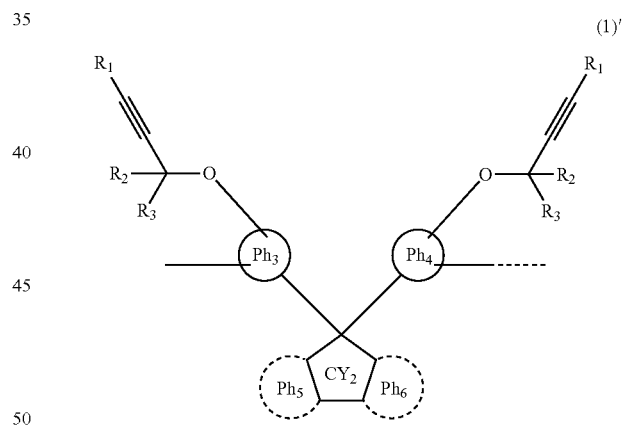

(1)' where $R_1$, $R_2$ and $R_3$ are each independently described in claim 18;

Cyclic $Cy_2$ is cyclopentane;

$Ph_3$ and $Ph_4$ are each independently $C_6$-10 aromatic hydrocarbon rings; and $Ph_3$ and $Ph_4$ are each independently $C_6$-10 aromatic hydrocarbon rings.

* * * * *